United States Patent [19]
Yi

[11] Patent Number: 6,094,427
[45] Date of Patent: *Jul. 25, 2000

[54] COMMUNICATIONS SYSTEM HANDOFF OPERATION COMBINING TURBO CODING AND SOFT HANDOFF TECHNIQUES

[75] Inventor: Byung Kwan Yi, Derwood, Md.

[73] Assignee: LG Information and Communications, Ltd., Seoul, Rep. of Korea

[*] Notice: This patent is subject to a terminal disclaimer.

[21] Appl. No.: 09/377,701

[22] Filed: Aug. 20, 1999

Related U.S. Application Data

[63] Continuation of application No. 09/110,395, Jul. 7, 1998, Pat. No. 5,978,365.

[51] Int. Cl.[7] .................................................. H04Q 7/38
[52] U.S. Cl. ........................ 370/331; 455/436; 455/442
[58] Field of Search ................................... 370/331, 334; 455/436–444

[56] References Cited

U.S. PATENT DOCUMENTS

| | | |
|---|---|---|
| 4,029,900 | 6/1977 | Addeo . |
| 4,455,602 | 6/1984 | Baxter, III et al. . |
| 4,493,027 | 1/1985 | Katz et al. . |
| 4,525,780 | 6/1985 | Bratt et al. . |
| 4,876,740 | 10/1989 | Levine et al. . |
| 5,103,459 | 4/1992 | Gilhousen et al. . |
| 5,109,390 | 4/1992 | Gilhousen et al. . |
| 5,184,347 | 2/1993 | Farwell et al. . |
| 5,195,090 | 3/1993 | Bolliger et al. . |
| 5,195,091 | 3/1993 | Farwell et al. . |
| 5,257,397 | 10/1993 | Barzegar et al. . |
| 5,265,119 | 11/1993 | Gilhousen et al. . |
| 5,267,262 | 11/1993 | Wheatley, III . |
| 5,278,892 | 1/1994 | Bolliger et al. . |
| 5,280,472 | 1/1994 | Gilhousen et al. . |
| 5,295,153 | 3/1994 | Gudmundson . |
| 5,299,198 | 3/1994 | Kay et al. . |
| 5,305,308 | 4/1994 | English et al. . |

(List continued on next page.)

OTHER PUBLICATIONS

Peter R. Denz et al., "Performance of Error Control Techniques for Wireless ATM", IEEE, pp. 1099–1103, Sep. 1998.

Naftali Chayat, "Turbo Codes for Incoherent M-ary Orthogonal Signaling", IEEE, pp. 471–474, Jun. 1996.

Frank Burkert et al., "Turbo Decoding with Unequal Error Protection applied to GSM speech coding", IEEE, pp. 2044–2048, May 1996.

*Primary Examiner*—Melvin Marcelo
*Attorney, Agent, or Firm*—McDermott, Will & Emery

[57] ABSTRACT

Communication systems, including, for example, cell-based mobile communication systems, multiple satellite communication systems, or multibeam satellite systems, require reliable handoff methods between cell-to-cell, beam-to-beam, or satellite-to-satellite respectively. Recent measurement of a CDMA cellular system indicates that the system is in handoff about 30% to 50% of an average call period. Therefore, system reliability during handoff is one of the major system performance parameters and eventually becomes a factor in the overall system capacity. The present invention advantageously relates to novel and improved techniques for handoff in cellular communications, multibeam and multisatellite systems. The present invention combines the soft handoff mechanism with a code diversity combining technique (i.e., combining signals from multiple sources), a packet combining technique (i.e., combining multiple signals), and an iterative decoding algorithm (e.g., Turbo Coding).

28 Claims, 16 Drawing Sheets

U.S. PATENT DOCUMENTS

| | | |
|---|---|---|
| 5,309,474 | 5/1994 | Gilhousen et al. . |
| 5,341,397 | 8/1994 | Gudmundson . |
| 5,357,513 | 10/1994 | Kay et al. . |
| 5,381,443 | 1/1995 | Borth et al. . |
| 5,416,797 | 5/1995 | Gilhousen et al. . |
| 5,432,822 | 7/1995 | Kaewell, Jr. . |
| 5,442,627 | 8/1995 | Viterbi et al. . |
| 5,446,747 | 8/1995 | Berrou . |
| 5,475,870 | 12/1995 | Weaver, Jr. et al. . |
| 5,485,486 | 1/1996 | Gilhousen et al. . |
| 5,513,176 | 4/1996 | Dean et al. . |
| 5,513,183 | 4/1996 | Kay et al. . |
| 5,533,011 | 7/1996 | Dean et al. . |
| 5,533,027 | 7/1996 | Åkerberg et al. . |
| 5,539,730 | 7/1996 | Dent . |
| 5,566,168 | 10/1996 | Dent . |
| 5,577,047 | 11/1996 | Persson et al. . |
| 5,581,575 | 12/1996 | Zehavi et al. . |
| 5,584,049 | 12/1996 | Weaver, Jr. et al. . |
| 5,602,833 | 2/1997 | Zehavi . |
| 5,602,834 | 2/1997 | Dean et al. . |
| 5,604,744 | 2/1997 | Andersson et al. . |
| 5,608,722 | 3/1997 | Miller . |
| 5,621,723 | 4/1997 | Walton, Jr. et al. . |
| 5,623,484 | 4/1997 | Muszynski . |
| 5,633,868 | 5/1997 | Baldwin et al. . |
| 5,640,414 | 6/1997 | Blakeney, II et al. . |
| 5,654,979 | 8/1997 | Levin et al. . |
| 5,668,837 | 9/1997 | Dent . |
| 5,673,259 | 9/1997 | Quick, Jr. . |
| 5,675,629 | 10/1997 | Raffel et al. . |
| 5,691,974 | 11/1997 | Zehavi et al. . |
| 5,694,414 | 12/1997 | Smith et al. . |
| 5,703,902 | 12/1997 | Ziv et al. . |
| 5,710,758 | 1/1998 | Soliman et al. . |
| 5,710,768 | 1/1998 | Ziv et al. . |
| 5,715,236 | 2/1998 | Gilhousen et al. . |
| 5,715,516 | 2/1998 | Howard et al. . |
| 5,717,689 | 2/1998 | Ayanoglu . |
| 5,722,074 | 2/1998 | Muszynski . |
| 5,724,610 | 3/1998 | Han et al. . |
| 5,907,582 | 5/1999 | Yi . |
| 5,978,365 | 11/1999 | Yi .............................................. 370/331 |

COMMUNICATIONS SYSTEM HANDOFF OPERATION COMBINING TURBO CODING AND SOFT HANDOFF TECHNIQUES

This application is a continuation of application Ser. No. 09/110,395 filed Jul. 7, 1998, now U.S. Pat. No. 5,978,365.

TECHNICAL FIELD

The present invention relates to communications systems. More specifically, the present invention relates to a novel and improved system for providing communications with a mobile station during a handoff between cell base stations or sectors thereof or between satellite beams and/or between satellites. The present invention combines a soft handoff mechanism with code diversity combining techniques, packet diversity combining techniques, and an iterative decoding algorithm (known as turbo coding). The system operates in either a code division multiple access (CDMA), frequency division multiple access (FDMA) or time division multiple access (TDMA) communications system.

BACKGROUND ART

In communications systems having geographically fixed stations and mobile stations, it is necessary to handoff the communications with the mobile station from a first fixed station to a second fixed station, as the mobile station moves farther away from the first fixed station and closer to the second fixed station. In the cellular communications context, as a mobile station travels out of a first cell and into a second cell, communications with the mobile station must be passed from a base station in the first cell to the base station in the second. Similarly, in the case of base stations provided on orbiting satellites, the position of the "mobile" unit on or near the surface of the Earth is relatively fixed compared to the orbiting satellites, and communications with this unit must be passed from a first base station to a second base station. The second base station can either be on a second satellite or can be associated with a second antennae on the first satellite which services a second beam (geographic region). Hereinafter, base station refers to a fixed base station on the ground or a base station provided on board an orbiting satellite.

There are three types of conventional handoff, depending on the multiple access system employed in the communications system: hard handoff, soft handoff, and softer handoff.

A hard handoff is characterized by a temporary disconnection of the forward and reverse channels and is typical in an FDMA or TDMA environment. As the mobile unit moves out of a currently serviced cell area or satellite beam during a communications session, the received signal becomes weak and a handoff is required. To perform the hard handoff, the communications system switches the communications session to a new channel while the session continues. In hard handoffs in FDMA or TDMA (or one CDMA system to another CDMA, system using different frequency spectrums), the receiver in the mobile unit stops demodulating and decoding information transmitted on the old channel link, from the cell or satellite link initially servicing the session, and then starts demodulating and decoding information transmitted via a second channel link.

In a conventional FDMA or TDMA cellular system, the handoff scheme implemented is intended to allow a call to continue when a mobile telephone crosses the boundary between cells. Then handoff from one cell to another is initiated when the receiver in the cell base station handling the call notices that the received signal strength from the mobile station falls below a predetermined threshold value. A low signal to noise ratio indication implies that the mobile telephone is on the cell boundary. When the signal level falls below the predetermined threshold value, the base station asks the system controller to determine whether a neighboring base station received the mobile signal with better signal strength than the current base station. The system controller in response to the current base station's inquiry sends messages to the neighboring base stations with a handoff request. The base stations neighboring the current base station employ scanning receivers which receive the signal from the mobile station on the specified channel.

A handoff will be attempted once one of the neighboring base stations reports an adequate signal level to the system controller. This scenario is called a "base station initiated handoff process." Handoff is then initiated when an idle channel from the channel set used in the new base station is selected. A control message is sent to the mobile station commanding it to switch from the current channel to the new channel. At the same time, the system controller switches the call from the first base station to the selected base station. In the conventional FDMA or TDMA system, a call will be dropped if the handoff of the new base station is unsuccessful. There are several reasons that a failure in handoff may occur.

For example, a handoff can fail if there is no idle channel available in the neighboring cells with proper signal strength.

a handoff can also fail if another base station reports hearing the mobile station in question, when in fact, the base station actually hears a different mobile station using the same channel in a completely different cell.

For the base station initiated hard handoffs occurring near cell boundaries, signal levels tend to fluctuate at both base stations. This signal level fluctuation gives rise to a "ping-ponging" situation whereby the mobile station is repeatedly instructed by an original base station to handoff the call to a neighboring base station, and then the neighboring base station instructs the mobile station to handoff back to the original base station.

This process is sometimes called "break before connect." Because a hard handoff is completed by a temporary disconnection of the traffic channel, information in the received signal may be lost.

The soft handoff (as used in a CDMA environment) alleviates the problem of the temporary disconnection. In a soft handoff, two or more received signals through different cells or satellites are simultaneously demodulated, combined, and decoded by the same receiver unit. Because the CDMA environment enables the receiver to simultaneously demodulate, combine and decode signals from more than one base station, the soft handoff does not require any disconnection of the traffic channels. A user moving into the service area of another base station or satellite beam does not need to change its receiving or transmitting frequency. A soft handoff is characterized by initiating communications using a new code sequence (i.e., with a new base station at a new cell or satellite) on the same CDMA frequency before terminating communications with the old code sequence.

One soft handoff system used in conjunction with a cellular communication system is described in U.S. Pat. No. 5,640,414 for the "Mobile Station Assisted Soft Handoff in a CDMA Cellular Communications Systems," issued to Blakeney II, et al. (the "Blakeney patent"), which is hereby incorporated herein by reference. The initiation of the handoff process is invoked by the mobile station measuring the signal power of the handoff-assisting pilot signal over the pilot channel in the CDMA system or by the base station measuring the signal power from the mobile station. A typical CDMA soft handoff is implemented by diversity combining (i.e., combining signals from either the same or different base stations) in conjunction with a RAKE receiver, thereby providing better call reliability than a hard handoff and supporting the handoff process between cells or beams in a manner that is transparent to the user.

As described in the Blakeney patent with reference to a cellular communications system, the mobile initiated handoff method is different from the base station initiated handoff method. The mobile initiated handoff relies on the mobile station to detect the presence or absence of pilot signals and the signal strength of the pilot signals. Thus, in order to perform a handoff initiated by a mobile station, the mobile station is equipped with a search receiver to scan pilot signals from other base stations. One reason to employ a mobile initiated handoff method is that the mobile station is more sensitive than base stations to changes in path between itself and various neighboring base stations.

In a conventional CDMA system, two types of handoff operations are implemented; the soft handoff and CDMA-to-CDMA hard handoff. The CDMA-to-CDMA hard handoff is similar to that of the TDMA or FDMA system, and call interruption may occur. It may be helpful in understanding the problems with existing systems to consider a CDMA and its soft handoff procedures in somewhat more detail.

In the soft handoff situation, the mobile station initiates the handoff process. The mobile station performs the signal diversity combining to/from multiple base stations. The mobile station employs RAKE receivers to receive communications simultaneously from the multiple base stations. A soft handoff occurs when the mobile station is communicating simultaneously with two or more base stations or with two or more sectors of the same base station before communications with the previous base station or sector is dropped. The latter case (i.e., between sectors within a cell) is called a "softer handoff". This is a special type of soft handoff, and no distinction is made herein between a soft and a softer handoff. In the soft handoff environment, the call between a mobile station and an end user is not interrupted by the eventual handoff from the base station corresponding to the cell from which the mobile station currently is being serviced to the base station corresponding to the cell from which the mobile station is to receive services.

FIGS. 1–3 depict a conventional CDMA system. As shown in FIG. 1, the diversity combiner receiver of the CDMA system at the mobile receiver includes a diplexer feeding a front end analog receiver 101, which supplies signals to multiple digital RAKE receivers 102A, 102B, 102C and to a searcher receiver 103. The receivers provide data to a diversity combiner 104. The output of the diversity combiner is connected to a decoder 105. If the mobile unit provides telephone service, the decoder supplies signals through base band processing circuitry and a vocoder, to provide signals to drive the handset speaker.

As shown in FIG. 2, the diversity combiner receiver of the conventional CDMA system at the base station has the same configuration as the mobile station except for the diplexer and the number of front end antennae and receivers. At the base station, two receiver systems are used for antenna diversity reception. These two systems independently receive the same CDMA signals and are combined at the diversity combiner 204. Thus, antennae 200A, 200B separately receive a signal from the mobile station, and each antenna supplies the signal to an analog receiver 201. The analog receiver is followed by multiple RAKE receivers 202A and 202B and a searcher receiver 203. The RAKE receivers 202A, 202B output the signals to a diversity combiner 204. Like the output of the diversity combiner 104 in the mobile station, the signal is then decoded in decoder 205. The base station forwards the decoded reverse channel information over a digital link to a master switching center (MSC).

FIG. 3 depicts the operation of the diversity combiner 104 or 204 in either the mobile station or the base station. The diversity combiner utilizes a maximal ratio combiner. The combiner first applies a specific weighted-signal-to-noise-ratio at 301A, 301B, 301C (which is based on their measured signal strength) to the incoming data signals from the individual receivers, here represented generically by receivers 302A, 302B, 302C. The diversity combiner then combines these weighted signals in the adder 303. The diversity combining scheme is termed "a maximal ratio combiner." The combining is coherent, since pilot signal demodulation allows aligning of multiple streams of received signals. The resulting combined signal is then decoded by decoder 304 using forward error correction. The conventional forward error correction uses the convolutional code with an appropriate Viterbi algorithm decoder. An exemplary conventional CDMA cellular system uses convolutional codes. Such a system has a code rate of ½ for the forward link from a base station to a mobile station and a code rate of ⅓ for the reverse link from a mobile station to the base station.

The conventional call processing operations during a soft handoff from base station A to base station B include the following:

1) The mobile station served by base station A scans and measures potential pilot signals for two or more base stations.
2) The mobile receiver detects the pilot signal from base station B which exceeds a predetermined threshold level.
3) The mobile station sends a pilot strength measurement message to base station A.
4) Base Station A receives the pilot strength measurement message and relays the message to base station B through the Master Switching Center.
5) Base station B begins transmitting the same traffic for the particular mobile station on the forward channel as that transmitted by base station A and acquires the reverse traffic channel from the mobile station.
6) Base stations A and B each send a handoff direction message to the mobile station to start demodulating signals from A and B.
7) The mobile station receives the handoff direction messages, acquires and demodulates the signal from base station B and begins diversity combining the signals from base stations A and B.
8) The mobile station sends a message to both base stations A and B informing both base stations that it is receiving signals from them both.
9) If the handoff Drop Timer expires as to the pilot signal from base station A, the mobile station sends a pilot strength measurement message to base stations A and B. If a signal from a base station remains below a predetermined threshold value for a predetermined amount of time (i.e., the period of the handoff Drop Timer), the signal from that base station will be dropped from the set of signals being processed by the mobile station as described in steps 10–13.

10) The base stations A and B send a handoff direction message to use only B to the mobile station.

11) The mobile station sends the handoff completion message to the base stations A and B informing the base stations that it will stop receiving signals from base station A.

12) The mobile station receives the handoff direction message, stops diversity combining and begins demodulating signals from base station B only.

13) Having received the handoff completion message, base station A stops transmitting on the forward traffic channel of the mobile station and receiving on the reverse traffic channel.

The mobile station initiated handoff method provides more reliable handoff and increased system performance than the base station initiated handoff. Diversity combining at the mobile station receiver of signals from multiple base stations in conjunction with the RAKE receiver allows the mobile receiver to receive multiple copies of the same CDMA signal from different base stations and multiple copies of the same signal from each base station.

The softer handoff, which is one special case of the soft handoff operation, occurs when a mobile station is moving from one sector coverage to another sector coverage in the same CDMA cell. The softer handoff uses the same procedures of the soft handoff except that the softer handoff occurs between sector antennae of the same base station instead of between base stations.

There are at least three reasons why the soft handoff is preferable over the hard handoff if system design allows.

Improved link quality. Cell boundaries (as used herein, "cell boundaries" also include beam boundaries for satellite systems and cell refers both to the coverage of a ground base station antenna or of a satellite beam) usually offer poor coverage coupled with increased interference from other cells. Therefore, forward traffic channel diversity from additional cells or satellites will improve link quality.

Controlled interference. A mobile unit consists of a mobile station for the cellular environment and a relatively fixed ground terminal from the satellite environment. While on a cell boundary, the mobile unit's interference to mobile units in other cells is maximal. The soft handoff enhances the ability to control the signal power of the mobile unit from these cells, thereby minimizing such interference.

Reduce call dropping probabilities. The forward link is most vulnerable in handoff areas. A slow handoff process coupled with a vehicle moving at a high speed or a fast moving satellite may cause the call to be dropped if the mobile unit is no longer able to demodulate the forward link transmitted from the original cell, thereby losing the handoff direction commands.

While each of the above described systems provide for handoffs of cellular calls, none of the systems provide handoffs that are as reliable as either a communications system provider or a communications system user would prefer. Common problems continue to occur in the handoff region of a given cell or satellite beam, including interference, fading (excessive path loss) or echoing (time delay spread phenomenon) of the signal, and multipath fading. Interference is caused by signals from neighboring cells. The mobile station may inadvertently interpret a signal from a neighboring cell or satellite and process the signal as through it was the intended signal to be received. Thus, it is possible that a user at a mobile station is interjected into a wholly unrelated communications session. In addition, the signal may fade as the distance grows between the mobile station and the base station. The distance between the transmitting end and the receiving end of a signal, combined with buildings and the topography of the surrounding terrain, may also cause the signal to be disrupted and, thus, faded. The multitude of signals that eventually reach the receiver may also have traveled via different paths from the transmitter. Because the path lengths are different, the signals will not arrive at the receiver at the same time. Thus, the receiver may process two different versions of the same information, causing frequency selective fading.

Many of these problems can be mitigated by channel coding the signals used to communicate with the mobile station. Present channel coding systems do not differentiate the signal sent from different base stations to the same mobile station as a handoff occurs. As discussed above, conventional CDMA cellular systems utilize multiple receivers to detect multipath signals and/or signals from different base stations. These signals are time delayed versions of the same coded signal and can be combined by a RAKE receiver and a diversity combiner. The conventional diversity combiner uses the maximal ratio combiner on the "same" signals received from different base stations, from different sectors or on different multipath signals. The receiver thus receives the same exact signal from both base stations during a handoff operation. Because the signals received from both base stations in the handoff region are the same coded signal, the amount of gain is limited to only the diversity combining gain and the designed coding gain.

Recently, new coding techniques have enabled communications systems designers to achieve greater coding gains. For example, the iterative coding technique described in U.S. Pat. No. 5,446,747 for an "Error-Correction Coding Method with at Least Two Systematic Conventional Codings in Parallel, Corresponding Iterative Decoding Method, Decoding Module and Decoder" issued to Claude Berrou (the "Berrou patent"), provides substantial coding gains compared with the conventional CDMA system whose coding gain on the forward link and return link are ½ and ⅓, respectively. The disclosure in the Berrou patent is hereby incorporated herein by reference. Such a coding scheme as described in the Berrou patent is commonly known as "turbo coding." Generally, turbo coding allows a single signal to be encoded in multiple manners for simultaneous transmission. Thus, multiple coded versions of the single signal can be received and combined to achieve increased coding gain. Moreover, a receiver that receives only one of the coded versions of the single signal still has enough information about the signal to adequately decode it.

To date, there have not been any communications systems which have taken advantage of turbo coding to enhance the systems performance in a handoff region and during the handoff operation. The Berrou patent suggests turbo coding only for a Gausian channel, not for a channel subject to fading. As a result, Berrou transmits only the information signal and two parity bit signals.

DISCLOSURE OF THE INVENTION

The present invention solves the above described problems by combining a constituent coding/encoding sequence such as turbo coding with a soft handoff operation, so that a station (mobile or master) can receive two differently coded data streams based on the same information signal via two different base stations involved in the handoff. The invention utilizes iterative decoding together with a combination of code combining and packet combining, in cellular and satellite based mobile communication systems. This enables the receiver to effectively combine the two coded information signals during the handoff, thus giving rise to lower code rates and enhanced performance of the cellular system.

Thus, it is an object of the invention to improve the quality of wireless communications during a handoff operation.

Another object of the invention is to enhance the performance of a communications system along the boundaries of a cell.

More specifically, it is an object of the present invention to use turbo coding or similar coding to enhance the performance of a soft handoff operation in a communications system.

It is an object of the present invention to effectuate a handoff by providing a mobile station with a first coded signal using an uninterleaved information sequence from one base station and a second coded signal using an interleaved information sequence (which differs from the first coded signal) from a second base station.

It is also an object of the invention to use turbo coding to provide two differently coded signals that can be combined by a mobile stations more clearly to achieve a powerful and higher code rate.

It is a further object of the invention to enable any type of communications system to utilize turbo coding to enhance the performance of the system, providing unprecedented coding gain.

To understand how the invention achieves the stated objectives, it may be helpful to first consider one aspect of the invention. In this aspect, the invention relates to a method for effectuating handoff of service for a mobile station between base stations, in a cellular communications system. Examples of appropriate cellular systems include land-based cellular systems and satellite type cellular systems.

The method involves communicating information between the mobile station and a first one of the base stations, using a turbo coding/decoding scheme with respect to a first version of the information. The strength of transmitted pilot signals from the first base station and from another base station are measured, to determine a need for handoff. During handoff, the communication of the information between the mobile station and the first base station continues, while communications are established between the mobile station the other base station. The communications between the mobile station and the second base station also use a turbo coding/decoding scheme, but the turbo coding for these communications is with respect to a second version of the information. In the preferred embodiments, the two versions of the information include the input information and an interleaved version of the input information. The method also includes terminating communications between the mobile station and the first base station when the pilot signal strength of the first base station falls below a predetermined level for a predetermined time period.

In a typical implementation, the communications with the other base station continue after termination of the communications with the first base station. The continuing communications, however, utilize the turbo coding/ decoding scheme based on the second version of the information.

Other aspects of the invention relate to systems and/or receivers for implementing the inventive mobile communications.

One such aspect of the invention relates to a mobile communication system. The system includes a source of digital data, for communication to or from a predetermined one of a plurality of mobile stations. In a cellular telephone example, the source might be a vocoder, either in the handset or somewhere in the cellular network.

A first constituent encoder, coupled to the source, encodes the digital data into a first code sequence. The system also includes an interleaver, to interleave the digital data. A second constituent encoder, coupled to the interleaver, encodes the interleaved digital data into a second code sequence. The system also includes two code puncturers, coupled to the constituent encoders. The first code puncturer combines selected data in the first code sequence with selected data from the second code sequence to form a first punctured code sequence. The second code puncturer selectively replaces data in the second code sequence with selected data from the first code sequence to form a second punctured code sequence. Two transmitters send information on two logical channels assigned to the predetermined mobile station. The system includes a control coupled to the first and second transmitters. During a handoff operation, the control causes the first transmitter to broadcast the first channel carrying the digital data together with the first punctured code sequence. During the handoff operation, the control also causes the second transmitter to broadcast the second channel carrying the interleaved digital data together with the second punctured code sequence.

The system elements may be elements of the network, for example including transmitters in base stations. Alternatively, the elements may be part of the mobile station. In the later case, for example, the mobile station would include transmitters for transmitting signals to two base stations during handoff. Preferred embodiments of the invention utilize the turbo coding/decoding scheme on both the forward channel from the base stations to the mobile station and on the reverse channel from the mobile station to the base stations.

Another aspect of the invention relates to a receiver system. The receiver system includes at least one antenna for receiving signals from the transmitters. Processing circuitry, coupled to the antenna, recovers data from the two logical channels during handoff. The receiver system includes an intelligent decoder, coupled to the processing circuitry. This element decodes signals from the first and second logical channels during handoff, to recover an accurate representation of the digital data.

In a preferred implementation, the receiver includes two demultiplexers, a code combiner and the intelligent decoder. The first demultiplexer processes the first received data stream, to recover digital data corresponding to the digital communication information and a first coded sequence. The second demultiplexer processes the second received data stream, to recover digital data corresponding to an interleaved version of the digital communication information and a second coded sequence. The code combiner is coupled to the first and second demultiplexers. The code combiner processes the two coded sequences, to recover a first constituent encoded sequence corresponding to the digital communication information and a second constituent encoded sequence corresponding to the interleaved version of the digital communication information.

The intelligent decoder is coupled to the code combiner. In this implementation, the decoder processes the recovered digital data corresponding to the digital communication information, the recovered interleaved version of the digital communication information and the first and second constituent encoded sequences, to produce an accurate representation of the digital communication information.

The intelligent decoder preferably is an iterative turbo decoder, although the invention encompasses other types of iterative decoders. The preferred iterative turbo decoder includes two MAP decoders, a packet combiner, two interleavers and two deinterleavers. The first MAP decoder is coupled to outputs of the code combiner corresponding to the recovered digital data corresponding to the digital communication information and the first constituent encoded sequence. The first interleaver interleaves the recovered data corresponding to the digital communication information and supplies the result to an input of the packet combiner. The packet combiner combines that data with the recovered interleaved version of the digital communication information and supplies the result to one input of the second decoder. The second interleaver interleaves the output of the first MAP decoder and supplies the result to a second input of the second MAP decoder. The second MAP decoder also is responsive to an output of the code combiner corresponding to the second constituent encoded sequence. The first deinterleaver provides feedback of extrinsic information regarding the uninterleaved information sequence from the second decoder to the first decoder, and the second deinterleaver deinterleaves an output from the second decoder to provide the output of the intelligent decoder after completion of a predetermined number of iterations.

While this specification discloses the use of turbo coding, other coding schemes such as conventional convolutional codes and product codes also could be used in connection with the present invention. This new technique provides (1) improved communication performance as measured by the BER (Bit Error Rate) and (2) improved communication-drop-probability compared to that of the conventional hand-off system. Therefore, the present invention increases system capacity through improved handoff reliability.

The present invention provides, for example, code rates of ¼ and ⅙ (1 over number of coded symbols per bit), respectively, during handoff without increasing the bandwidth requirement, and still provides respective forward and reverse link coding rates of ½ and ⅓ during normal in-cell (or single satellite beam) operation served by a single base station. This code rate enhancement is achieved by transmitting the original sequence with the properly punctured parity checks through one base station and interleaved data sequence with the other pattern of the punctured parity check sequence through the other base station. At the receiver, the interleaved sequence and the uninterleaved original sequence are combined by the packet combiner, and punctured parity check sequences are combined by the code combiner. The code combining and the packet combining techniques provide coding gain and mitigate detrimental fading effects on cellular and satellite systems.

A system employing a turbo-coding technique for satellite digital audio broadcasting is described in the co-pending U.S. patent application Ser. No. 08/908,045 entitled "Method and System for Turbo Coded Satellite Digital Audio Broadcasting." which is by the same inventor and is assigned to same assignee as the present invention. The disclosure of the foregoing application is hereby incorporated herein by reference.

The combination in the present invention of the handoff process with the iterative decoding process provides an inherently robust, seamless transition which is completely transparent to users. It provides the "softest" and the most reliable handoff in a cellular and multibeam and/or multiple satellite environment compared to prior art handoff methods.

The present invention allows even FDMA and TDMA systems a type of soft handoff mechanism by combining code diversity and packet combining with an iterative decoding; provided that the receiving entity has the capability of communicating via two channels—two frequency diversity receivers for FDMA and for multicell TDMA, or two time slots in single cell TDMA. For example, the signal from the two base stations in an FDMA or TDMA environment are differently coded with appropriate puncturing and are differently combined at the receivers to achieve a higher code rate.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF DRAWINGS

The drawing figures depict the present invention by way of example, not by way of limitations. In the figures, like reference numerals refer to the same or similar elements.

BEST MODE FOR CARRYING OUT THE INVENTION

The present invention improves call reliability during the handoff operation, when compared to that of the conventional, diversity combining soft handoff technique. This enhancement is provided by implementing code diversity combining and packet combining in conjunction with an iterative decoding process during handoff operations. The improved communications may be used on either the forward link, the reverse link, or both. Also, the present invention is applicable both to land-based cellular systems and satellite-based cellular systems.

A system employing a turbo-coding technique for satellite digital audio broadcasting is described in the co-pending U.S. patent application Ser. No. 08/908,045 entitled "Method and System for Turbo Coded Satellite Digital Audio Broadcasting" which is by the same inventor and is assigned to same assignee as the present invention. The disclosure of the foregoing application is hereby incorporated herein by reference.

Figure 1:
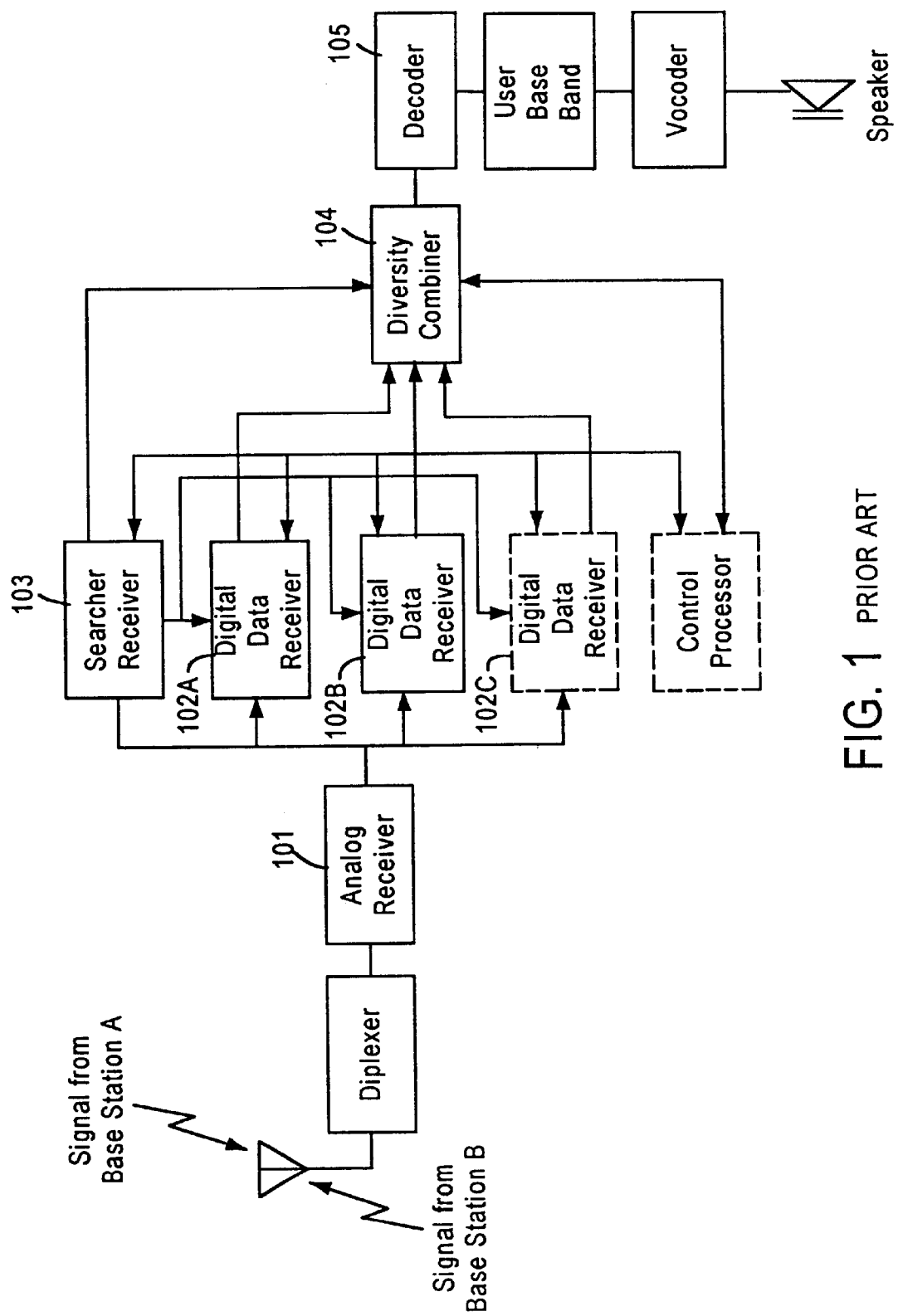
FIG. 1 is a block diagram of a conventional CDMA diversity combiner receiver at a mobile station.
Figure 2:
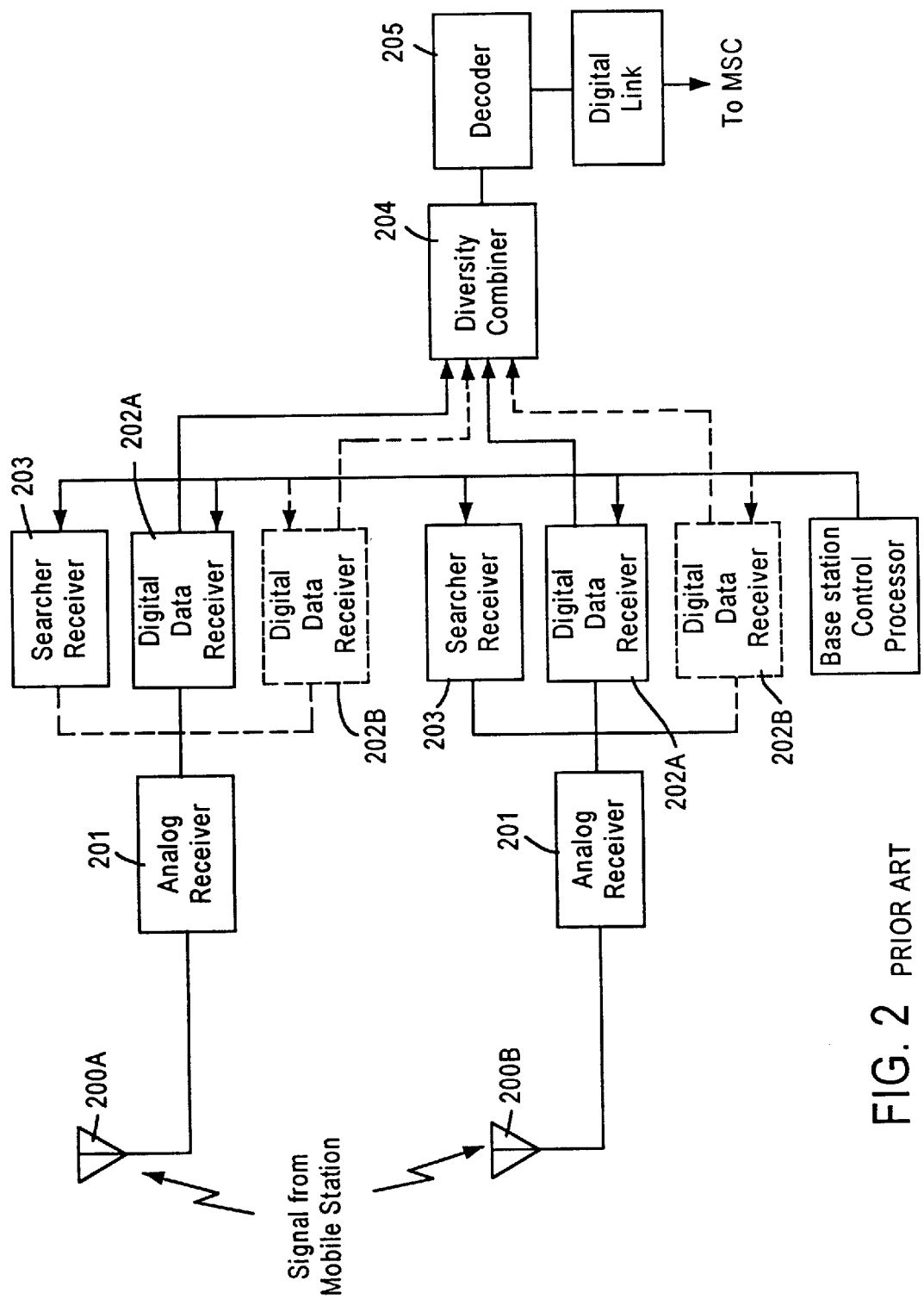
FIG. 2 is a block diagram of a conventional CDMA diversity combiner at a base station operating on a reverse traffic channel.
Figure 3:
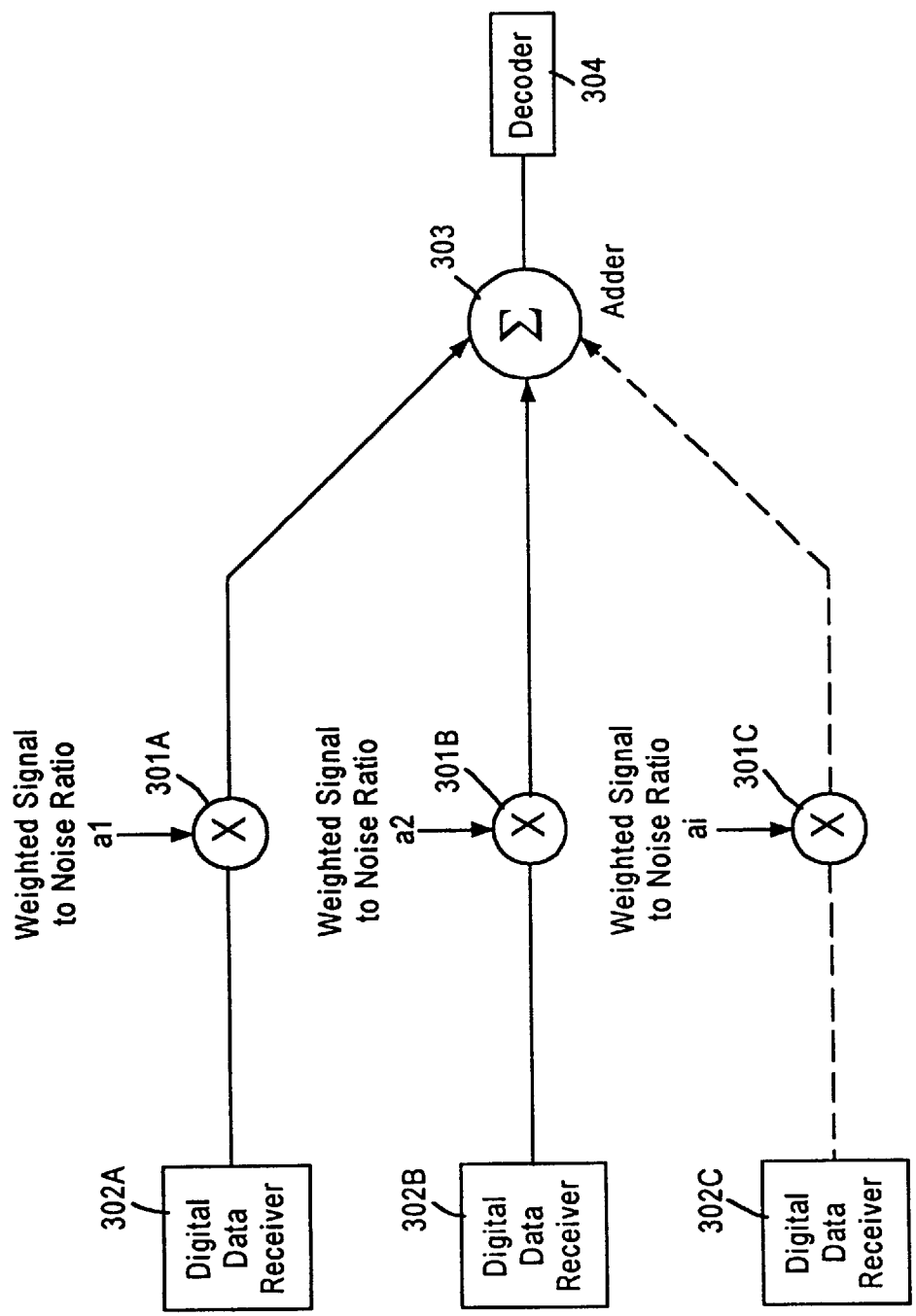
FIG. 3 is a graphical representation of a diversity combiner at either a mobile station or a base station.
Figure 4:
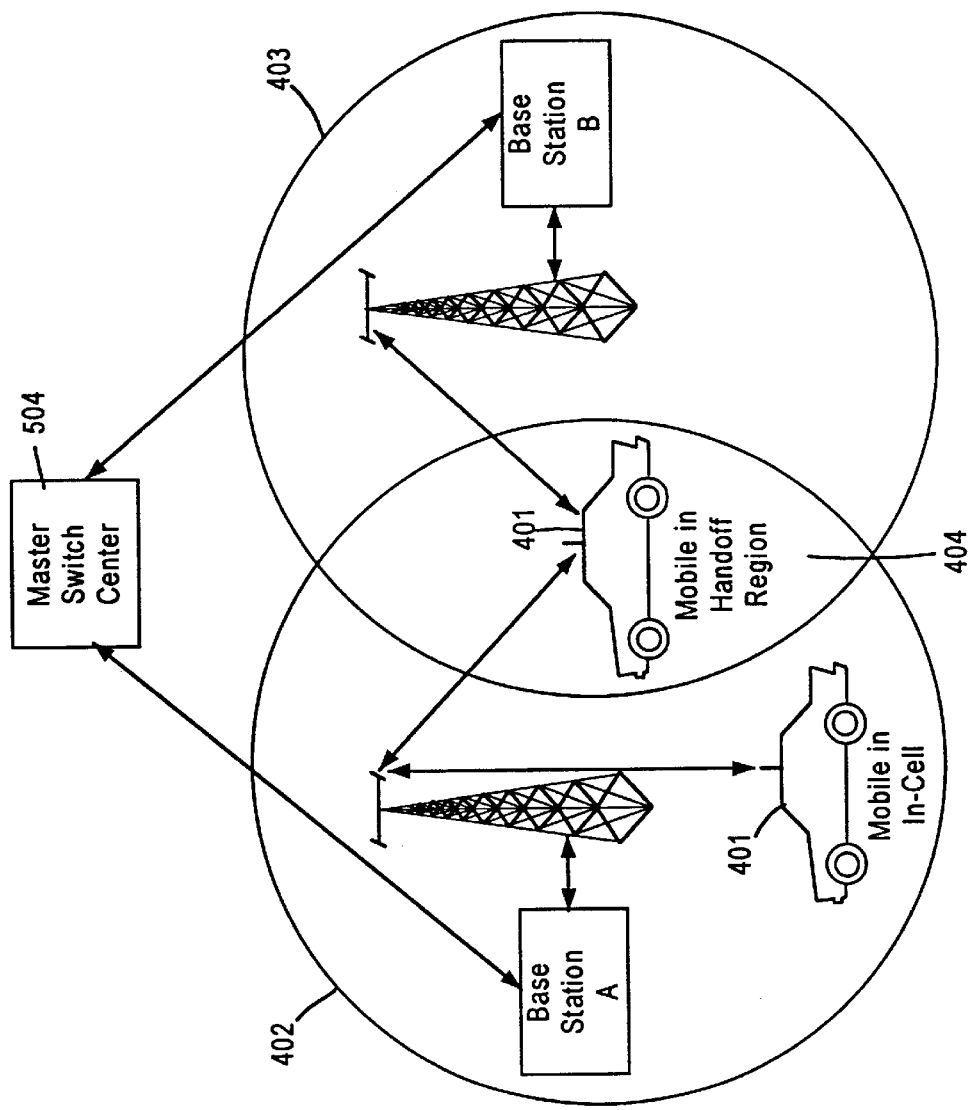
FIG. 4 is a schematic representation of two base stations engaging in a hand-off of a mobile station.

As illustrated in FIG. 4, if a mobile station 401 travels from the coverage area 402 of the base station A to the coverage area 403 of the base station B, a handoff process must occur to maintain the call signal integrity. Handoff typically occurs when the mobile station 401 is in the handoff region 404.

The example shown is a land-based cellular network having separate base stations serving different cells or areas of coverage. The term 'base station' here refers to any station having a relatively fixed service area in relation to the mobile station, at least during the communication session with the mobile station. The base stations may be collocated and effectively form one station serving separate cells. The 'base stations' may include transceivers in one or more satellites, and a variety of other arrangements are contemplated.

As envisioned by the present invention, both base stations communicate with the mobile station 401 during the handoff process. In the preferred embodiment, both base stations send turbo encoded signals to the mobile station to provide the seamless and transparent or "softest" handoff. As discussed more later, it also is preferred that both of the base stations A and B receive turbo encoded signals from the mobile station 401 during handoff.

The iterative coding scheme of the turbo encoded signal, as disclosed in the Berrou patent, provides not only unprecedented coding gain for the given code rate which is near the theoretical channel capacity limit, but also a highly flexible system approach by utilizing inherently built in features—code diversity combining, and interleaving. The current novel invention provides higher call reliability during handoff than that of incell normal single path operation using only one base station with a strong signal strength above the threshold level.

This invention is not limited to the mobile initiated handoff process described earlier. It can be used for the base station initiated handoff process without its previously described shortcomings, since the performance of this invention is more robust against signal fluctuation which causes unstable and frequent handoffs. This invention also is not limited to voice communication. The wireless communications can carry any digital data, including voice, image, video, text file, or multimedia information.

As noted, concepts of the invention may apply to both forward channel and reverse channel communications. Consider. first an application to forward channel communication specifically, during a handoff. The illustrative schematic of the processing of the forward traffic signals from base stations A and B during a handoff appears in FIG. 5.

In this example, the master switch center (MSC) 504 first digitizes and properly encodes the forward traffic signal, for example through the use of a vocoder 501. The digital data here is that intended for transmission to a predetermined user's mobile station or receiver. The vocoder 501 supplies the digital data for that station to a turbo encoder 502. If the traffic is some information other than voice, the digital information may come from some other type of source within or connected to master switch center 504.

The forward traffic signal is turbo encoded in 502, to combat the channel noise and fading. The outputs of the turbo encoder 502 at MSC 504 are separately switched to appropriate base stations A (505A) and B (506B). As discussed in more detail later, the data stream sent to one of these base stations comprises the digital data stream intended for the particular mobile receiver and a first punctured code sequence. The data stream sent to the other base station comprises an interleaved version of the same data intended for the particular mobile station and a second punctured code sequence.

Figure 5:
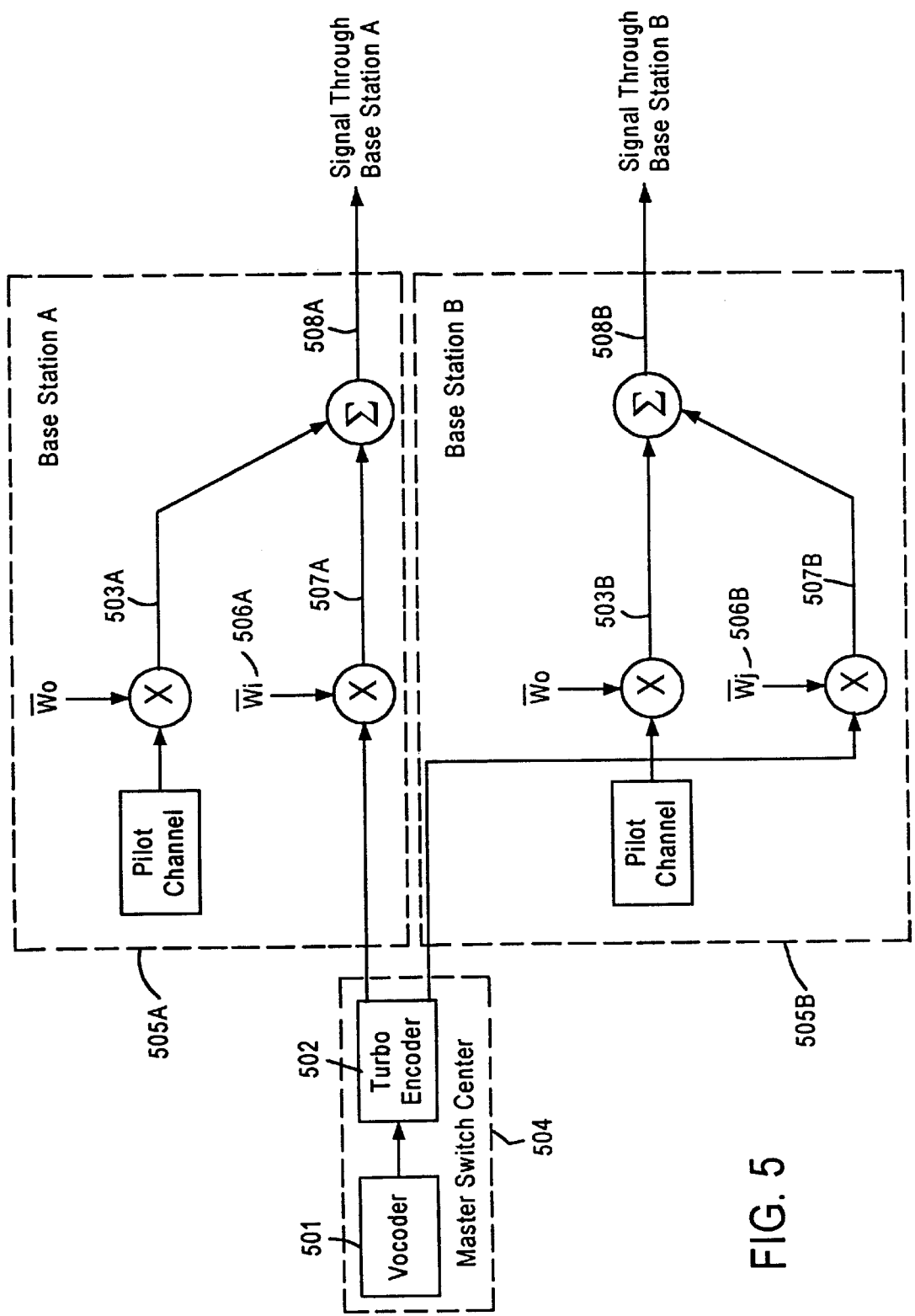
FIG. 5 is a block diagram of forward traffic signal processing for transmission during a hand-off period.

In the base stations 505 A and B the data streams are modulated by the proper Walsh sequences $W_i$ 506 and $W_j$ 507 in the known manner for the conventional CDMA systems, and power control bit insertion schemes and synch, paging and other traffic channels are omitted in FIG. 5 to simplify presentation of the current invention. Walsh modulated pilot signals 503A, 503B are then added with the respective Walsh modulated turbo encoded signals 506A, 506B. The resulting signal 508A, 508B are modulated then transmitted from the respective base stations.

The turbo coding technique of the preferred embodiment produces at least four streams of bits for transmission. The first stream is the digital data stream or traffic information intended for the particular mobile station. As part of the encoding process, the encoder also generates an interleaved representation of the digital data stream or traffic information intended for the particular mobile station. The other two streams are punctured code sequences. Each punctured code sequence comprises selected portions of two constituent encoded parity sequences. One constituent encoded parity sequence is formed by processing of the digital data or traffic information intended for the particular mobile station. The other constituent encoded sequence is formed by processing of the interleaved representation of the digital data stream or traffic information intended for the particular mobile station.

In accord with the invention, one base station 505A transmits or broadcasts the signal 508A containing the digital data or traffic information intended for the particular mobile station and the first punctured code sequence. In a typical scenario, a mobile station may receive this signal 508A while in a first area comprising the cell coverage area or sector serviced by the base station transmitter 505A. During a handoff, the other base station involved in the handoff transmits or broadcasts the signal 508D containing the interleaved version of the digital data or traffic information intended for the particular mobile station and the second punctured code sequence. As such, the transmission from the second station is not the same as that from the first station.

During handoff, the mobile station receives the broadcasts from both base stations, including all four of the bit streams.

Thus, for one bit of original digital information produced by the source vocoder 501 in the master switch center 504, the mobile station 401 receives up to four bits of turbo encoded information from the two base stations 505A, 505B, for a code rate of '¼'.

In a typical scenario, the mobile station completes the handoff from the station A to the station B. The system terminates the transmissions from the station A but continues the transmissions from the station B. As such, the receiver in the mobile station continues to receive the signal 508B for as long as it remains in the second area comprising the cell coverage area or sector serviced by the base station transmitter 505B. The operating status, whether a mobile station is operating the signal through base station A, through base station B or both, is controlled by the master switching center and is broadcast to the mobile station.

If the session with the mobile station continues, the mobile station may pass back through the same handoff region into the cell for base station A or pass through another handoff region into a cell for a third base station. This second handoff will operate much the same as the first, except that the new station will be sending the uninterleaved data signal and the equivalent of the first punctured code sequence.

In some cases, the mobile station actually may receive transmissions from three or more base stations during a handoff. In any such situation, one, two or more base stations may transmit the uninterleaved data and associated punctured stream; and one, two or more base stations may transmit the interleaved data and associated punctured stream. The receiver treats these duplicative transmissions much the way it would treat multi-path versions of the transmissions from one base station. The front end circuitry in the receiver combines all copies of the uninterleaved data and associated punctured stream into one set of those signals for decoding; and the front end circuitry in the receiver combines all copies of the interleaved data and associated punctured stream into one set of those signals for decoding.

The central processing unit of the master switching center 504 tracks which bit streams go to each of the base stations. The central processing unit in turn controls the switching functionality of the center to supply the correct streams to the respective base stations. The control in the receiver also controls operations based on notation of the particular streams communicated to or from respective base stations.

During in-cell, normal operation in which a single base station is the only server for a mobile station, the transmitter and the receiver configuration is the same as for a handoff period. When receiving from a station such as A, the receiver at the mobile station of this invention automatically estimates missing elements of the interleaved sequence and the punctured parity sequences for the iterative decoding from the systematic uninterleaved sequence and by inserting neutral values: "zeros". Similarly, when receiving from a station such as B, the receiver automatically estimates missing elements and the interleaved sequence and the punctured parity sequences from the systematic interleaved sequence and by inserting neutral values: "zeros".

Figure 6:
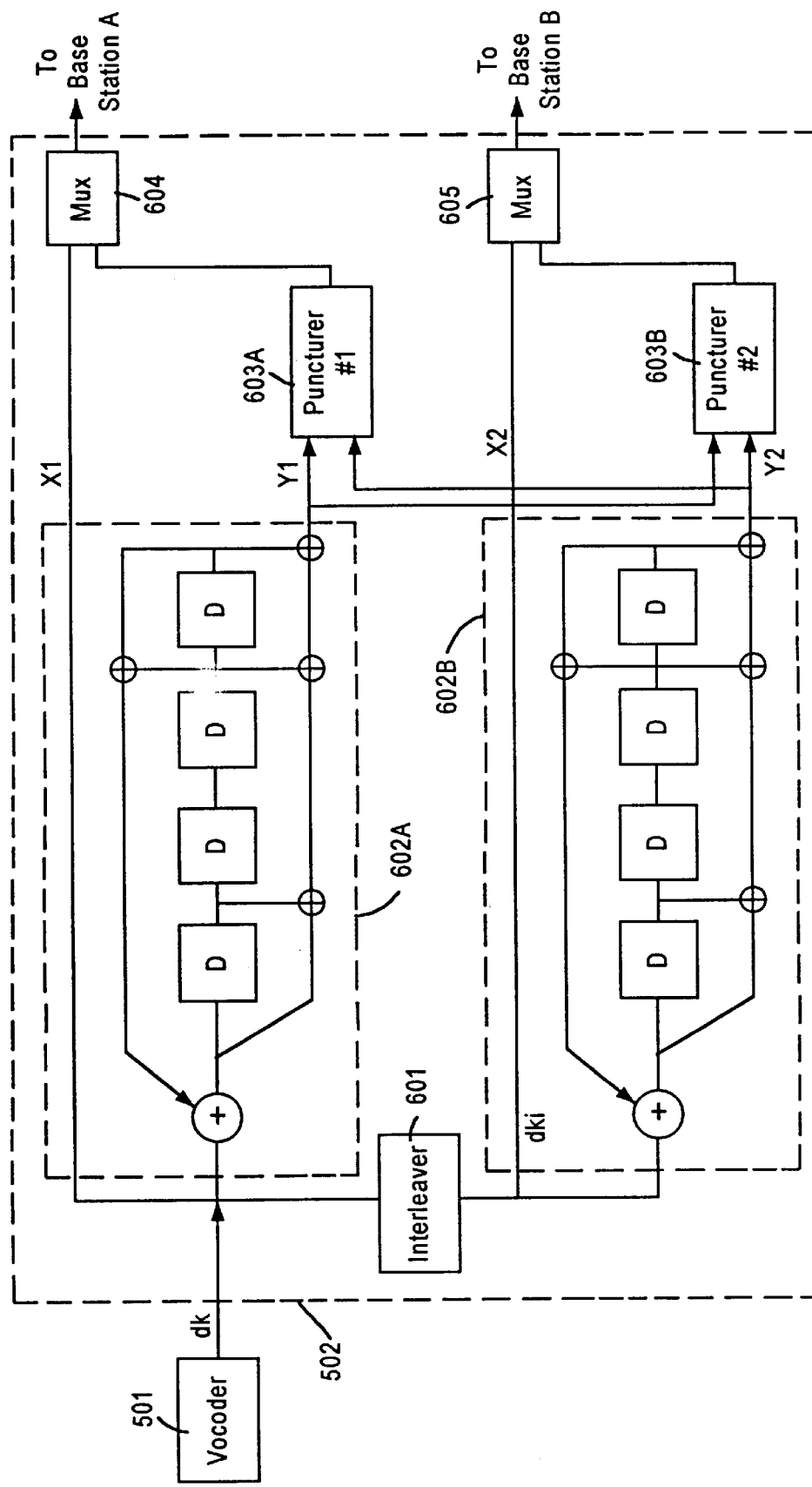
FIG. 6 is a block diagram of a turbo encoder used during a handoff period.

FIG. 6 depicts the functional elements of the previously discussed turbo encoder 502. The turbo encoder 502 includes an interleaver 601 between two constituent recursive convolutional encoders 602A, 602B to permute the incoming digital voice information sequence in a random fashion. The two encoders could implement a variety of coding algorithms.

The size of the interleaver 601 and the permutation algorithm are important parameters in turbo coding performance. Typically, as the interleaver size increases, the performance of the system is likewise enhanced. However, the interleaver size is limited by system constraints such as allowable voice latency and frame error rate. For example, voice communication cannot tolerate high latency; thus, it can have an interleaver size up to approximately 400 bits. Other data communications such as image, video, file transfer do not have such limitations on the interleaver size. Typical cellular system applications transport a variety of digital data, but they also must accommodate digital communication of voice telephone-type traffic.

Permutation by the interleaver 601 breaks the cross-correlation between the two encoded sequences. The permutation method can be a purely random interleaver whose permutation map is generated randomly or can be the systematic algorithm proposed in the Berrou patent. The small interleaver permutation should be optimized using the interleaver design algorithm proposed by P. Roberson (Ref.; Interleaver Design Method). The present invention is not limited to any permutation algorithm or interleaver size.

The operation of exemplary constituent encoders 602A, 602B in FIG. 6 can be described by the polynomial representation:

$$(1, g_2/g_1) = (1, 1+D+D^3+D^4/1+D^3+D^4) \tag{1}$$

Conventional octal representation for the illustrated code is $(g_1, g_2) = (27, 33)$. Here, the $g_1$ represents the feed back connection and $g_2$ represents the feed forward connection. The constituent encoders 602A and 602B are illustrated as identical with each having four memory elements and the same polynomial representation. However, the present invention is not limited by this particular polynomial nor by the number of memory elements, which is one less than the constraint length.

Figure 7:
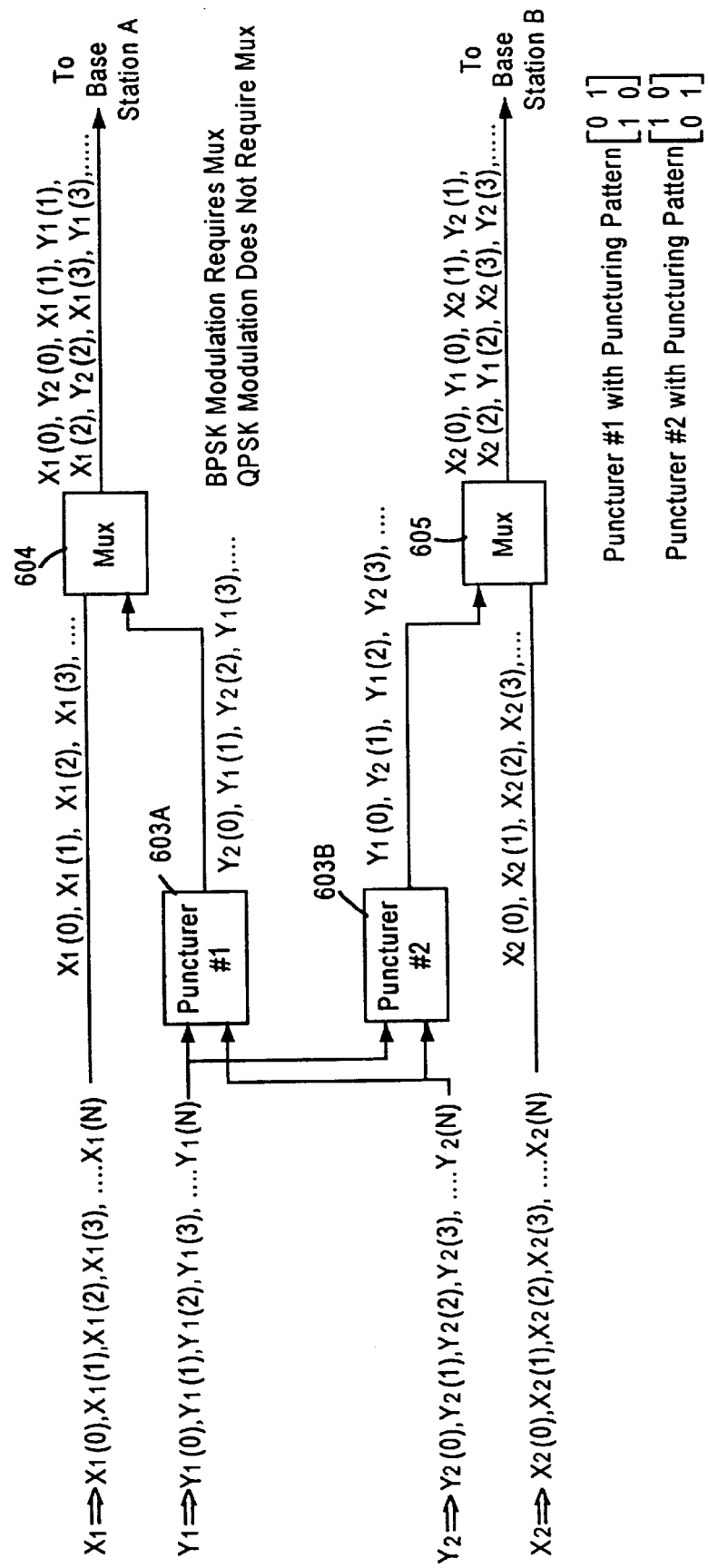
FIG. 7 is a diagram of the puncturers and multiplexers used in the turbo encoder of FIG. 6.

The parity sequence outputs $Y_1$, $Y_2$ of the two encoders 602A, 602B are input to parity punctures 603A, 603B to generate two different punctured sequences described in greater detail with regard to FIG. 7. The puncturers 603A, 603B output the punctured sequences to the multiplexer 604 and the multiplexer 605, respectively. The punctured parity sequence outputs are ismultiplexed with the data streams $X_1$ and $X_2$, which represent the unaltered source sequences $d_k$ and interleaved sequences $d_{ki}$.

Assume for discussion that the mobile station is engaged in a voice telephone type call. In a handoff operation, the original voice data sequences represented as $d_k$ in FIG. 6 are supplied to the encoder 602A, which outputs an unaltered copy of the systematic voice data $X_1$ to one input of multiplexer 604 for ultimate transmission to the signal path to base station A. The voice data $d_k$ is also supplied to the first constituent recursive convolutional encoder 602A, which supplies parity output $Y_1$ to one input of the first puncturer 603A and to one input of the second puncturer 603B. The voice data sequences $d_k$ are also supplied to interleaver 601. The interleaver 601 permutes the received sequence of $d_k$ and generates $d_{ki}$, through the permutation method described above. The second constituent recursive convolutional encoder 602B receives an interleaved voice data signal $d_{ki}$. Unaltered interleaved signal $d_{ki}$ is supplied in systematic form as sequence $X_2$ to one input of the multiplexer 605 for ultimate transmission to the signal path to base station B. A copy of $d_{ki}$ is supplied to the second constituent encoder 602B which encodes each interleaved bit of audio data and generates a parity sequence $Y_2$, which is supplied to both puncturers 603A, 603B.

As shown in FIG. 7, the first puncturer 603A punctures the parity outputs $Y_1$ and $Y_2$, generated by voice data sequence $d_k$ and $d_{ki}$ (as shown in FIG. 6), according to the puncturing pattern [0,1/1,0] in an alternating $Y_1$ and $Y_2$ bit output sequence. The second puncturer 603B punctures the parity outputs $Y_2$ and $Y_1$ generated by uninterleaved voice data sequence $d_k$ and interleaved voice data sequence $d_{ki}$, according to the puncturing pattern [1, 0/0, 1] in an alternating $Y_1$ and $Y_2$ bit output sequence. The master switch center supplies two streams to each base station. In our example, during handoff, the master switch center supplies the data stream X1 for the original digital information and the first punctured code sequence from the puncturer 603A in multiplexed form to the base station A. The master switch center supplies the interleaved version X2 of the digital information and the second punctured code sequence from the puncturer 603B in multiplexed form to the base station B.

In this manner, according to a presently preferred embodiment of the invention, the forward transmissions can provide a punctured code rate of ½ for each signal path to one of the base stations A and B during handoff (or during an in-cell operation). By transmitting the uninterleaved systematic sequence $X_1$ and interleaved systematic sequence $X_2$ in conjunction with the use code diversity combining and packet combining at the receiver in the mobile station, the system provides an overall code rate ¼ during handoff, to provide improved performance over the known handoff methods. The forward channel of the conventional CDMA system is limited to a code rate of ½.

The turbo encoded voice data signal to be transmitted is comprised of data sequences $X_1$, $Y_1$, $X_2$, and $Y_2$. The wholly unaltered voice data and information portion of $d_k$ represented as $X_1$, has the following sequence:

$$X_1 => x_1(0), x_1(1), x_1(2), x_1(3) \ldots, x_1(n), \ldots, x_1(N); \quad (2)$$

where n–the bit timing index; and
N=frame size.

The frame size N is determined by adding the interleaver size and tail bit sequence to terminate the trellis being zero state. In this example, a 4 tail bit sequence is needed because of the four bit memory as shown in FIG. 6.

Similarly, the second interleaved uncoded voice data sequence $d_2$ is represented as $X_2$ and has the following sequence:

$$X_2 => x_2(0), x_2(1), x_2(2), x_2(3) \ldots, x_2(n), \ldots, x_2(N); \quad (3)$$

where n=the bit timing index; and
N=frame size.

The first constituent encoder 602A generates (1) the systematic sequence output $X_1$; and (2) the parity sequence output $Y_1$ using uninterleaved sequence $d_k$. The second constituent encoder 602B generates (1) the systematic interleaved sequence $X_2$; and (2) parity sequence output $Y_2$ using interleaved sequence $d_{ki}$. Parity sequence output $Y_1$ has the following sequence:

$$Y_1 => y_1(0), y_1(1), y_1(2), y_1(3), \ldots, y_1(n), \ldots, y_1(N); \quad (4)$$

where n–the bit timing index; and
N=frame size.
Parity sequence output $Y_2$ has the following sequence:

$$Y_2 => y_2(0), y_2(1), y_2(2), y_2(3) \ldots, y_2(n), \ldots, y_2(N); \quad (5)$$

where n–the bit timing index; and
N=frame size.

As the punctured pattern is applied to the $Y_1$ and $Y_2$ sequences by the puncturers, the output of the first puncturer 603A has the following sequence;

$$y_2(0), y_1(1), y_2(2), y_1(3), \ldots; \quad (6)$$

as a result of the puncturing pattern [0,1/1,0].

The output of the second puncturer has the following sequence:

$$y_1(0), y_2(1), y_1(2), y_2(3), \ldots; \quad (7)$$

as a result of the puncturing pattern [1,0/0,1].

The resulting punctured outputs are multiplexed with sequence $X_1$ and $X_2$ at multiplexer 604, 605, respectively. The outputs of the two encoders yield the code rate of ¼ overall, and are punctured and multiplexed into two separate signal paths A and B—each with the individual code rate of ½. Accordingly, the output sequence from multiplexer 604 is represented as:

$$x_1(0), y_2(0), x_1(1), y_1(1), x_1(2), y_2(2), \quad (8)$$

The output sequence of multiplexer 605 is represented as:

$$x_2(0), y_1(0), x_2(1), y_2(1), x_2(2), y_1(2), \quad (9)$$

During a handoff, the output of multiplexer 604 is transmitted to the base station A and the output of multiplexer 605 is transmitted to the base station B simultaneously. Spreading and combining processes are performed on each of the forward traffic channels associated with the base stations involved in a handoff, for example in a manner described U.S. Pat. No. 5,103,459 entitled "System and Method for Generating Signal Waveforms in a CDMA Cellular Telephone System."

Thereafter, at the mobile station's receiver, if both the signal from base station A and the signal from base station B are available, as they should be during handoff, the code diversity combining and packet diversity combining of the present invention achieves an overall code rate of ¼ based on one data bit, one interleaved bit and two parity bits per one input systematic bit $d_k$.

This coding process greatly enhances the performance of conventional CDMA cellular systems. Such systems are compromised because the same signal is present at the mobile station's receiver from each base station, wasting valuable power and bandwidth without improved coding gain. The conventional CDMA mobile station receiver receives the same signal from both base stations and overall performance is limited to a code rate of ½. In the present invention, the signal from each base station will have all the information necessary for estimating the missing voice data from any other base station in communication with the mobile station and for successfully performing the iterative algorithm. In addition to the improved performance from the code rate of ¼, other advantages include reduction or mitigation of fading, shadowing, and/or other loss of transmitted signal. The actual bit error rate (BER) of the present invention during a handoff with a code rate of ¼ results in better performance than that of the normal in-cell operation served by a base station with a code rate of ½. This performance advantage and the user transparency during the handoff period provides "the softest handoff".

Figure 8:
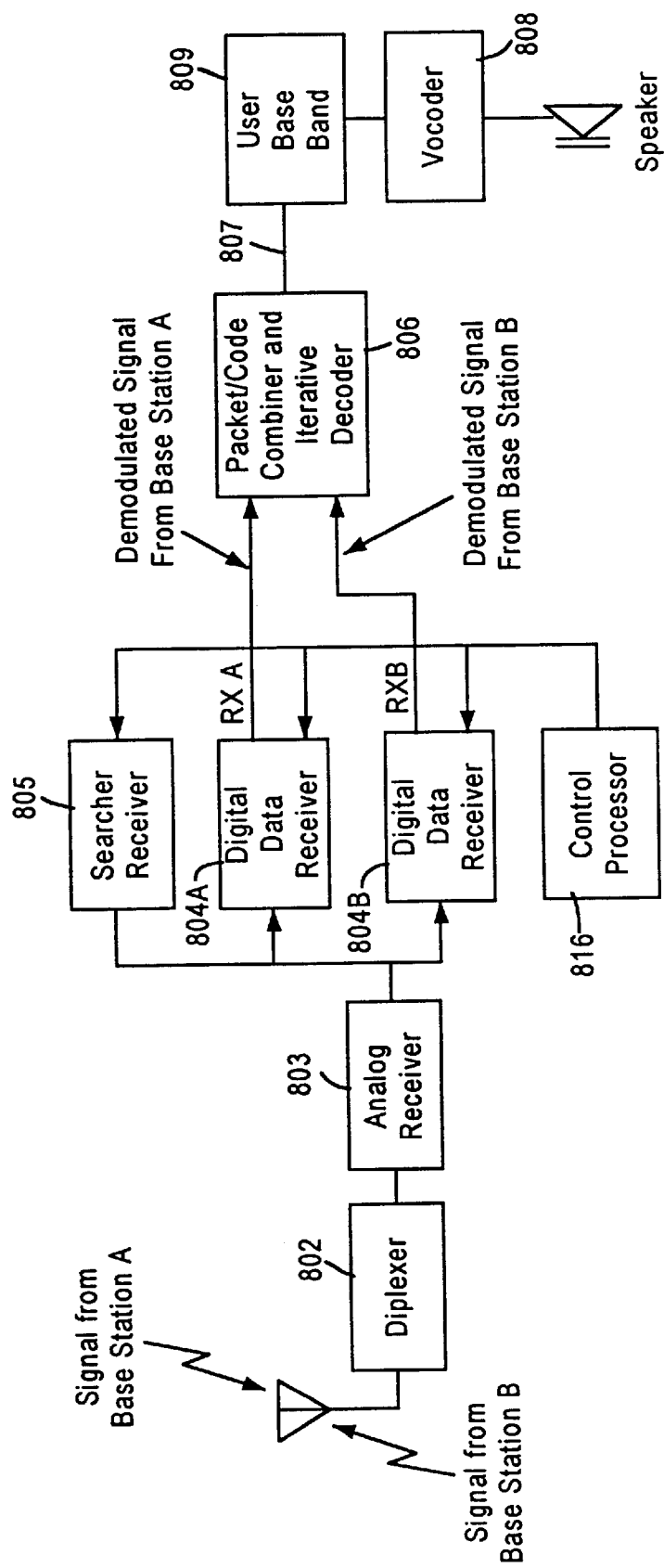
FIG. 8 is a block diagram of a mobile station receiver.
Figure 9:
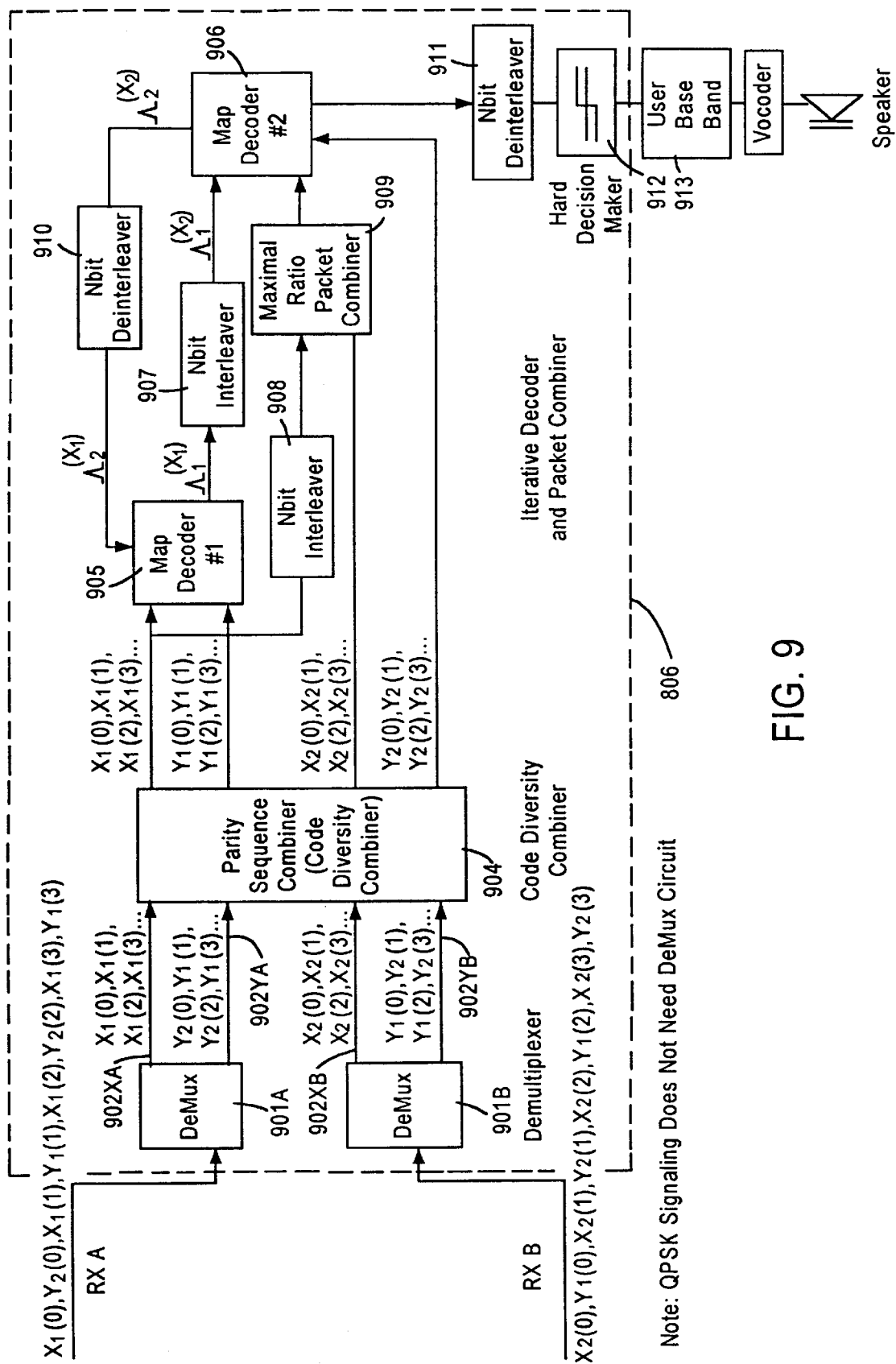
FIG. 9 provides a diagram illustrating a packet/code combiner and iterative decoder used in the receiver of FIG. 8.

FIGS. 8 and 9 depict an exemplary mobile station receiver of the present invention.

The mobile station includes an antenna 801, which is connected to a diplexer 802 to permit simultaneous transmission and reception through the single antenna. For convenience of this discussion, FIG. 8 shows only the received signal processing elements. The diplexer 802 provides the received signals to the analog receiver 803. In normal in-cell operation, the antenna collects signals from a singular serving base station. The analog receiver 803 receives RF signals from the Diplexer, amplifies, and converts the signals to an IF frequency, for application to a digital receiver 804A, 804B and a search receiver 805. During the handoff, the antenna collects transmitted signals from base station A and base station B.

The antenna 801, diplexer 802, and analog receiver 803 are of standard elements of the CDMA cellular circuitry described for example in U.S. Pat. No. 5,109,390 entitled "Diversity Receiver in a CDMA Cellular Telephone System" and incorporated herein by reference. The standard design of the mobile station includes a transmit signal amplifier, a transmit power control unit, and a transmit modulator. However, these units are omitted from the FIGS. 8 and 9 for ease of illustration.

The IF signal pass through a bandpass filter with a proper bandwidth to match the transmitted waveform. The output of the matched filter is then digitized by an A/D converter (not shown) for converting IF signals to a digital signal. The digitized signal is provided to each of three receivers, one of which is a searcher receiver 805, with others being data receivers 804A, 804B. The searcher receiver 805 continuously scans the pilot signals from the base station currently serving the mobile station, as well as the pilot signals from other base stations in the vicinity, for the handoff processing. It measures the ratio of a received pilot signal's energy-per-chip to total received interference spectral density, including the noise as a measure of the pilot signal strength.

The measured pilot signal strength is used by the control processor 816 to select and to process signals from two different base stations A and B during the handoff period. Receiver 804A processes signals from base station A including a multipath signal from base station A. Receiver 804B processes signals from base station B including a multipath signal from base station B.

The receivers 804A, 804B of the present invention process two differently coded signal streams from two different base stations, instead of processing the same signals from both base stations as in a conventional CDMA receiver. The outputs of receivers 804A and 804B are RxA and RxB, respectively. These digital output sequences are provided to packet/code combiner and iterative decoder 806. The packet/code combiner and iterative decoder 806 facilitates the improved handoff method.

The outputs RxA and RxB are fully demodulated signal streams from base station A and B. For example, the RxA input at the packet/code combiner and iterative decoder 806 comprises the sequence of $$x_1(0),y_2(0),x_1(1),y_1(1),x_1(2),y_2(2),x_1(3),y_1(3), \quad (10)$$

and the RxB input at the packet/code combiner and iterative decoder is fed in the sequence of $$x_2(0),y_1(0),x_2(1),y_2(1),x_2(2),y_1(2),x_2(3),y_2(3), \quad (11)$$

These are the identical sequences as the outputs from the multiplexers 604, 605 but corrupted by noise and by fading. Ultimately these signals (10) and (11) are processed to form a very reliable voice signal sequence 807 which is supplied to a vocoder 808 through the user baseband processor circuitry 809.

As illustrated in FIG. 9, the packet/code combiner and iterative decoder 806 advantageously performs demultiplexing to separate systematic voice data sequence from the multiplexed signals and depunctures parity check sequences. Through this depuncturing and reshuffling processes, code combining is achieved. The packet/code combiner and iterative decoder 806 includes a demultiplexing stage having two demultiplexers 901A, 901B that demultiplex each of the signals RxA and RxB, respectively. As noted, these input signals to the demultiplexers 901A, 901B are estimations of the encoded voice data signal sequences corrupted with channel noise and other external factors such as fading.

Each of the demultiplexers 901A and 901B separates the RxA and RxB data into systematic recovered data information sequences 902XA and 902XB and recovered punctured parity check data sequences 902YA and 902YB. The code combiner 904 depunctures the sequences and achieves the code diversity combining, so as to output systematic forms of uninterleaved recovered information signal sequence $X_1$ and a recovered first depunctured parity sequence $Y_1$ to a first MAP decoder 905. This first MAP decoder 905 is symmetric to the first recursive systematic convolutional encoder 602A of the turbo encoder. The diversity combiner 904 also outputs systematic form of recovered interleaved information signal sequence $X_2$ and corresponding recovered second depunctured parity sequence $Y_2$. The recovered interleaved information signal sequence $X_2$ is output to the maximal ratio packet combiner 909, and the second depunctured parity sequence Y2 is output to a second MAP decoder 906. The operation of the second decoder 906 is likewise symmetric to a second recursive systematic convolutional encoder 602B. For example, input signals to the parity sequence combiner 904 from the two demultiplexers may be as follows:

$$902XA=x_1(0),x_1(1),x_1(2),x_1(3),\ldots;$$

$$902YA=y_2(0),y_1(1),y_2(2),y_1(3),\ldots;$$

$$902XB=x_2(0),x_2(1),x_2(2),x_2(3),\ldots; \text{ and}$$

$$902YB=y_1(0),y_2(1),y_1(2),y_2(3), \quad (12)$$

The parity sequence combiner 904 reshuffles both the uninterleaved and interleaved parity sequences 902YA and 902YB. Thus, the outputs of the parity sequence combiner 904 are as follows:

$$x_1(0),x_1(1),x_1(2),x_1(3),\ldots;$$

$$y_1(0),y_1(1),y_1(2),y_1(3),\ldots;$$

$$x_2(0),x_2(1),x_2(2),x_2(3),\ldots; \text{ and}$$

$$y_2(0),y_2(1),y_2(2),y_2(3), \quad (13)$$

The first MAP decoder 905 further receives a feedback loop from the second MAP decoder 906 as defined herein. Such use of the previously estimated data sequence improves the reliability of successive iterations. This reliability information and feedback loop has been depicted as "extrinsic information" in the turbo code literature and is well understood.

The MAP decoders 905, 906 are known in the art as powerful constituent Maximum A Posteriori Probability (MAP) decoders. On the first iteration, the MAP decoder accepts the input of the noise-ridden $X_1$ and $Y_1$ sequences as supplied by the parity sequence combiner 904 and the feedback signal is set to a neutral value (set to "zero"). The output of the first MAP decoder 905 is indicative of extrinsic information of the original digital information signal $d_k$, which is the reliability of the decoded data sequence and is represented as $\Lambda_1^{(x1)}$ The extrinsic information signal is supplied to an interleaver 907 to interleave the information with the same permutation algorithm as the encoder interleaver 601.

The output signal $\Lambda_1^{(x2)}$ from the interleaver is fed to the second MAP decoder 906 as a priori information about the data sequence $X_2$. The output $X_1$ of the parity sequence combiner 904 is supplied to the interleaver 908, to interleave that information with the same permutation algorithm as the encoder interleaver 601. The output of of the interleaver 908 is combined with $X_2$ in the maximal ratio packet combiner 909, to achieve packet diversity combining of the encoded signals from the base station A and the base station B, using a conventional maximal ratio combining algorithm. The maximal ratio combining is accomplished by adding two weighted signal streams whose weighing factors are proportional to the measured signal strengths.

The output of the maximal ratio combiner is expressed by:

$$X_2(\text{combined}) = a_1 X_1(\text{interleaved}) + a_2 X_2 + tm \quad (14)$$

where $a_1$ and $a_2$ are measured relative signal strengths for $X_1, X_2$ respectively. The maximal ratio packet combiner 909 provides a significant improvement over the prior art and operates to combine digital data information from base station A and interleaved voice data information from base station B. The signal output from the maximal ratio packet combiner 909 is supplied as one input of the second MAP decoder 906.

The interleaved extrinsic information of the first MAP decoder 905 output is supplied to the second MAP decoder 906 as a priori information. The output $Y_2$ of the parity sequence combiner 904 is supplied to the second MAP decoder 906.

The second MAP decoder 906 operates on the extrinsic information, namely combined interleaved sequences $X_2$ (combined) and $Y_2$. The second MAP decoder 906 also outputs the reliability data about $d_{ki}$ as an extrinsic feedback signal $\Lambda_2^{(x2)}$. This signal is supplied to a deinterleaver 910 (of the feedback loop) which operates to undo the interleaving of the estimated voice data sequence of $d_k$. The second deinterleaver 911 supplies the final $d_k$ estimation output signal to a hard limiter 912 after the predetermined number of iterations between the first MAP decoder 905 and the second MAP decoder 906.

The number of iterations performed depends on the system performance criteria such as final bit error rate, latency tolerance, and allowable processing power. Because the tight limitation of the voice communication in latency, the number of iterations is bounded at two and a half (2½) for the exemplary presentation. However, data such as video, images, and multimedia communications which do not suffer by the latency can have a higher number of iterations as needed. The hard decision maker (limiter) 912 operates in a known manner on the supplied signal to form $d_k$ after a predetermined number of iterations, so as to output one of two binary states for each bit. For example, everything above zero is assigned +1, everything below zero is assigned −1.

For voice telephone type source information, the $d_k$ signal is supplied to the user base band process 913 and vocoder, to decode the voice data signal and to supply it to a speaker for listening by a user. For other types of traffic or information, the bit stream output of the limiter may go to appropriate digital data processing equipment, e.g., for data display, video processing, etc.

A simpler from of MAP decoders 905, 906 can also be used with the present invention, such as a SOVA (soft output Viterbi algorithm) decoder as suggested by Hagenauer or simpler form of soft input soft output decoders.

Figure 10:
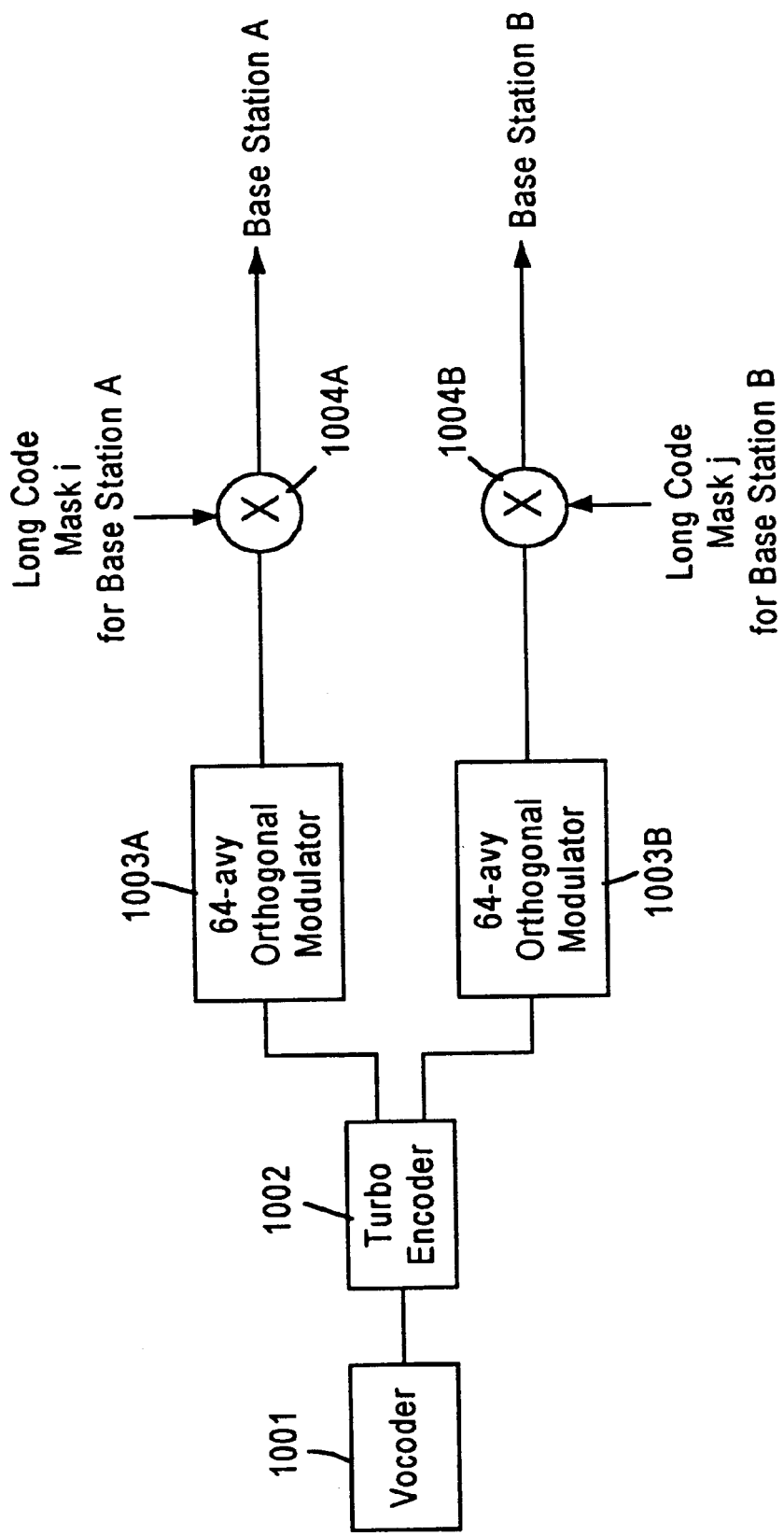
FIG. 10 is a block diagram of a reverse traffic signal transmitter at a mobile station, showing the signal processing during a handoff period.
Figure 11:
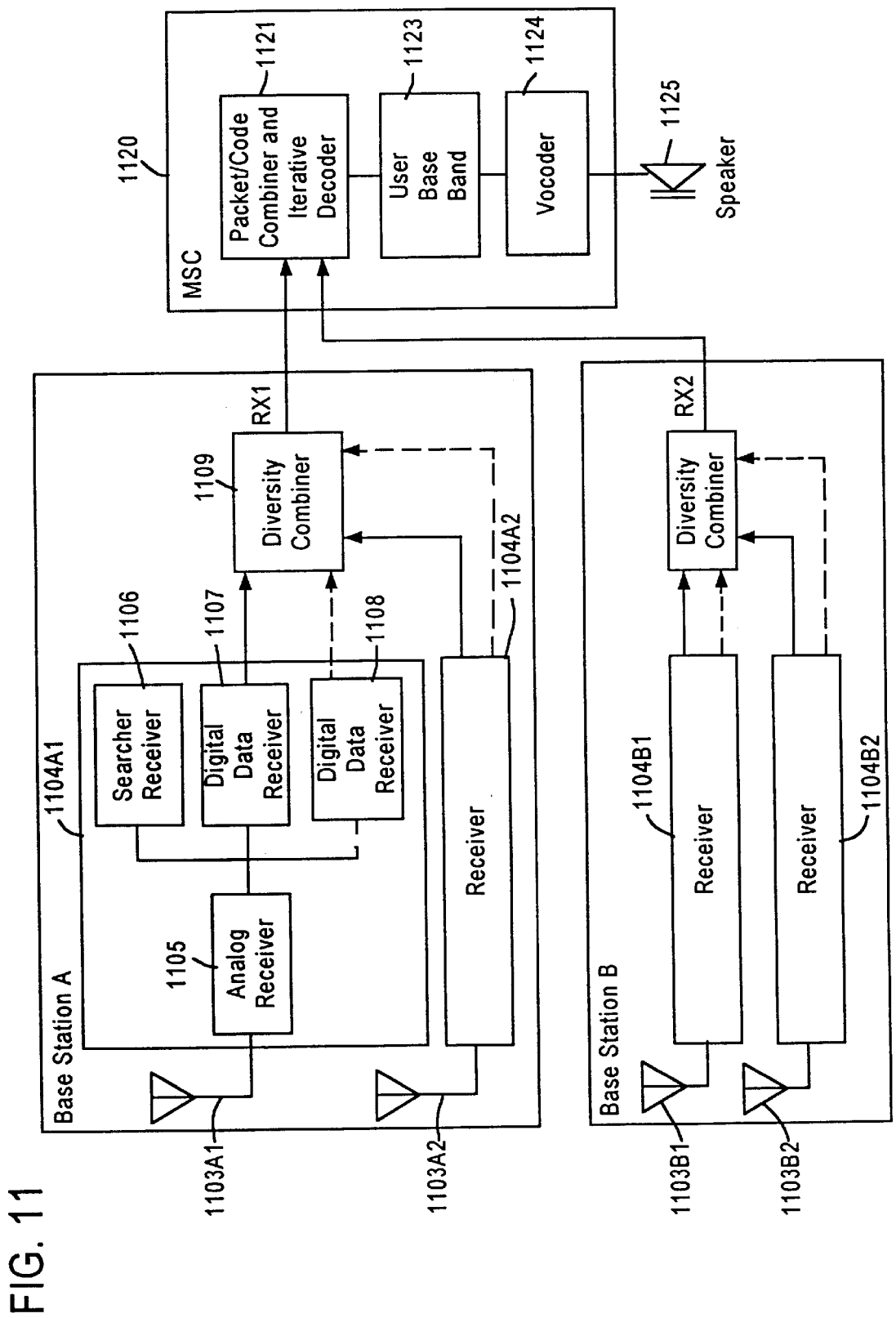
FIG. 11 is a block diagram of reverse traffic receivers at two a base stations, and a master switching center, with emphasis on illustration of the reverse channel signal processing during a handoff period.

In the first example discussed so far, the cellular network utilized the inventive coding/decoding for handoff for communication on the forward channel. The invention can also can be applied to the reverse traffic signal from a mobile station to the base stations A and B. FIGS. 10 and 11 depict the reverse channel processing elements of the mobile station and base station, particularly as used during a handoff operation.

Figure 14:
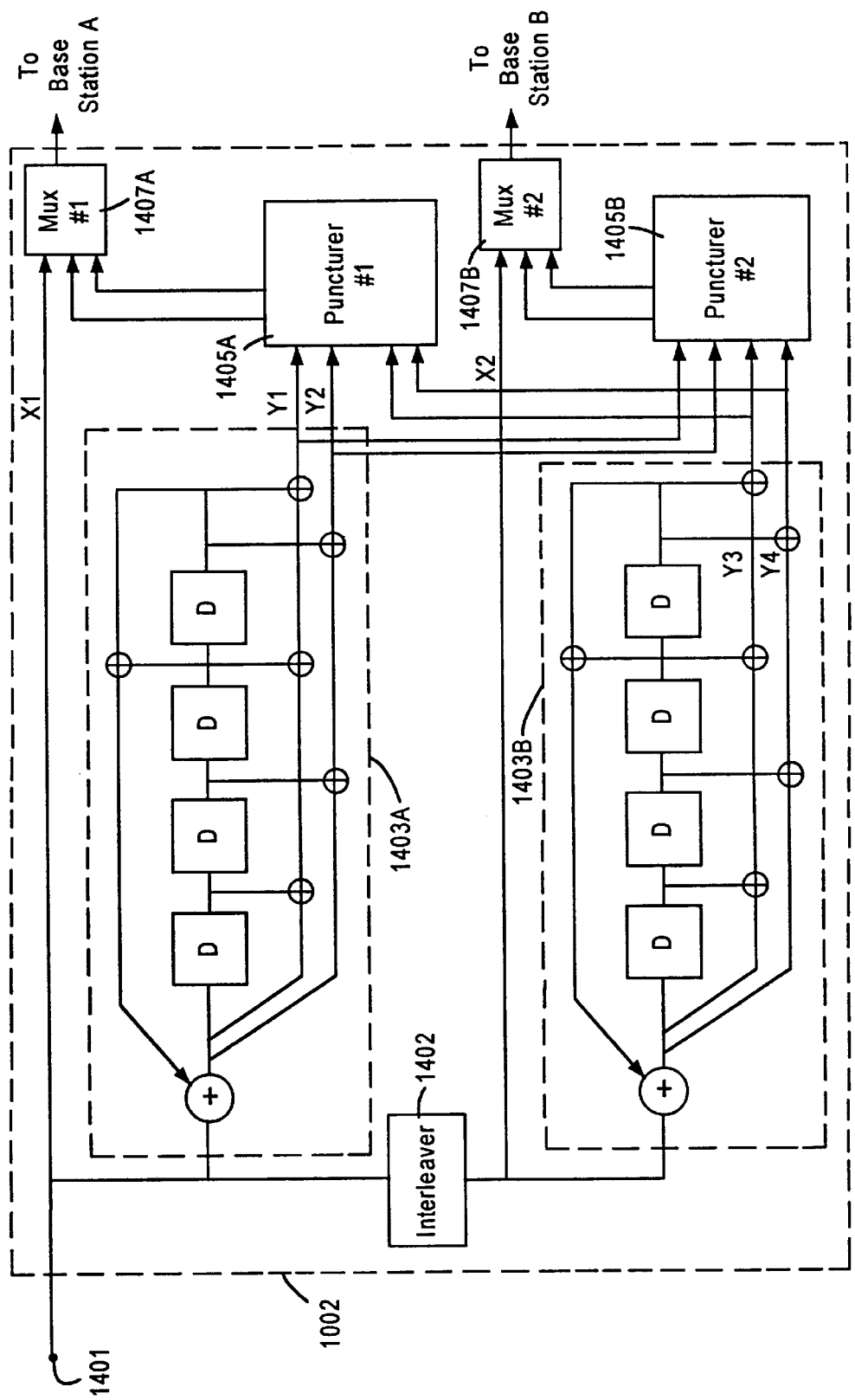
FIG. 14 is a functional block diagram illustration of an embodiment of a turbo encoder system, for example, for a reverse link with a code rate ⅙.

As shown in FIG. 10, the mobile station contains a vocoder 1001 and a turbo encoder 1002. The vocoder 1001 supplies the turbo encoder 1002 (FIG. 14) with voice signals. The vocoder 1001 supplies the turbo encoder 1002 with unaltered voice signal $d_k$ as shown in FIGS. 10 and 14. In the reverse traffic direction, it is possible to achieve to a code rate of ⅙ by using a second set of taps in each encoder to create two additional coded parity data sequences (e.g., $Y_2, Y_4$), as discussed more later. After the signal is encoded, the signal is first modulated by orthogonal modulators 1003A, 1003B and then marked with the appropriate long code at 1004A, 1004B for the respective base stations servicing the call during the handoff. This modulation and masking of the code is conventional and known in the art.

The receivers at the base stations A and B involved in a handoff process are illustrated in FIG. 11. Each of the base stations has at least two antennae 1103A1, 1103A2, 1103B1 and 1103B2. Each antenna connects to a receiver 1104A1, 1104A2, 1104B1 and 1104B2. Each antenna provides its received signal to its respective receiver. Only details for one of the receivers 1104A1 is shown. The other receiver 1104A2, 1104B1 and 1104B2 are similar).

Like the receivers in the mobile stations shown in FIG. 8, the receivers in the base station contain an analog receiver 1105, various digital data receivers 1106, 1107 and a searcher receiver 1108. These perform functions similar of the analogous components in the recovery of FIG. 8. Due to the path diversity generated by the two antennae, e.g., 1103A1, 1103A2, the signals received by the separate receivers in a single base station must be combined by a diversity combiner 1109 prior to decoding. The combined signal is finally supplied to the packet/code combiner and iterative decoder 1121 at the master switching center 1120. The packet/code combiner and iterative decoder 1121 operate in a manner illustrated in FIG. 16. Once the signal is decoded, it is fed through the switch network (not shown) to a user base band processor 1123 and a vocoder 1124 to transmit the signal as audio information to a speaker 1125 for listening by an end user.

Figure 12:
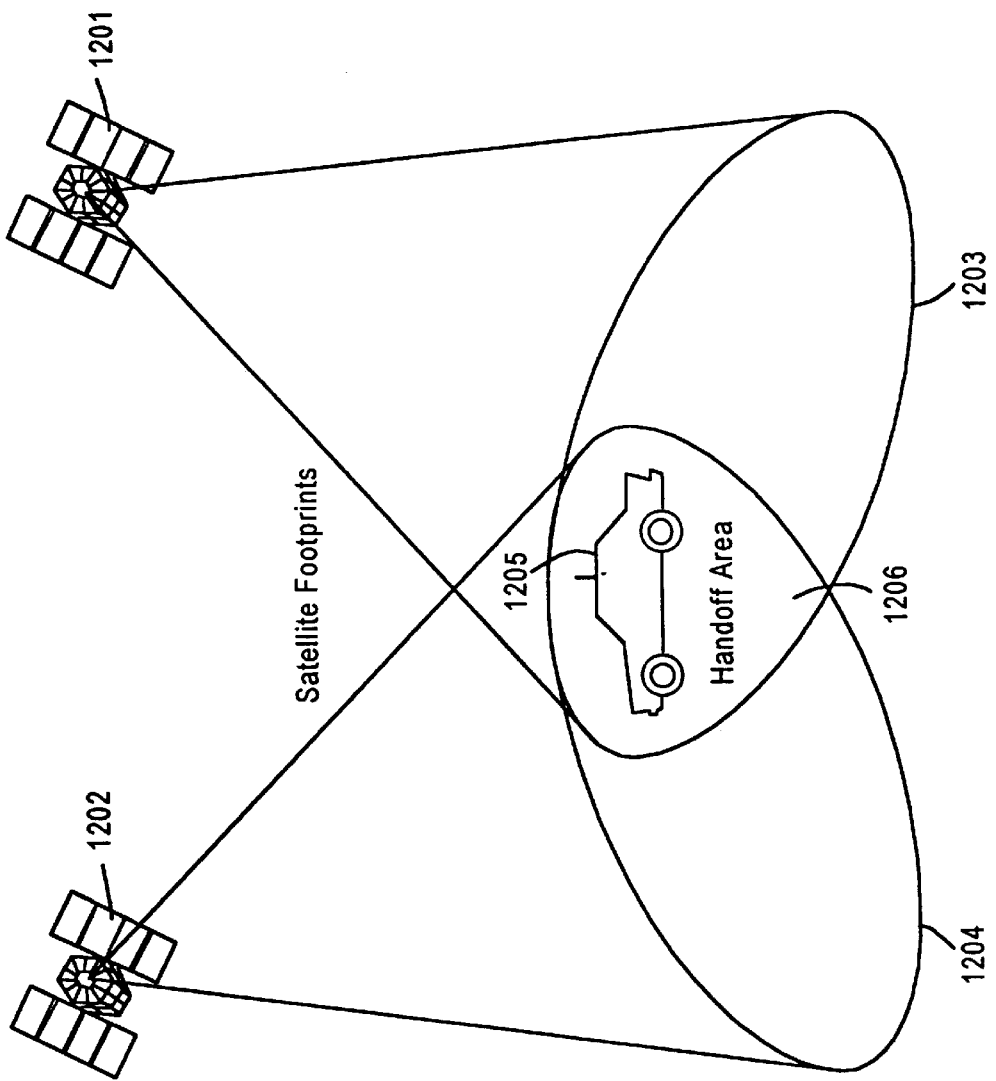
FIG. 12 is a representation of a multiple satellite system with a mobile station, which may incorporate the invention.

For ease of understanding, the discussions above have concentrated on landbased cellular communication systems. Additionally, the invention can be utilized in the multiple satellite system, which must have the handoff ability to maintain either a voice communication or data communication session. In such an embodiment, e.g. as shown in FIG. 12, the handoff occurs when a mobile unit 1205 enters an area 1206 where the footprints from two satellites overlap. A satellite's footprint is the area on the ground that is covered by the satelliteIs beam. A first satellite 1201 has a footprint 1203. The satellite 1201 has a transmitter for broadcasting signals into the footprint and a receiver system for receiving signals from the footprint, in a manner analogous to the cellular embodiments. A second satellite 1202 has a separate footprint 1204. Again, the satellite provides transmission and reception similar to that in the above discussed cellular systems. Footprint 1203 and footprint 1204 overlap in handoff area 1206. Satellite communications systems typically arrange the satellite beams such that the footprints overlap in order to insure that there is no gap in service between footprints. As the mobile unit 1205 enters the handoff area 1206, the same exact soft handoff procedures and recursive convolutional iterative decoding described above can be used to effectuate the handoff in this multiple satellite system.

Figure 13:
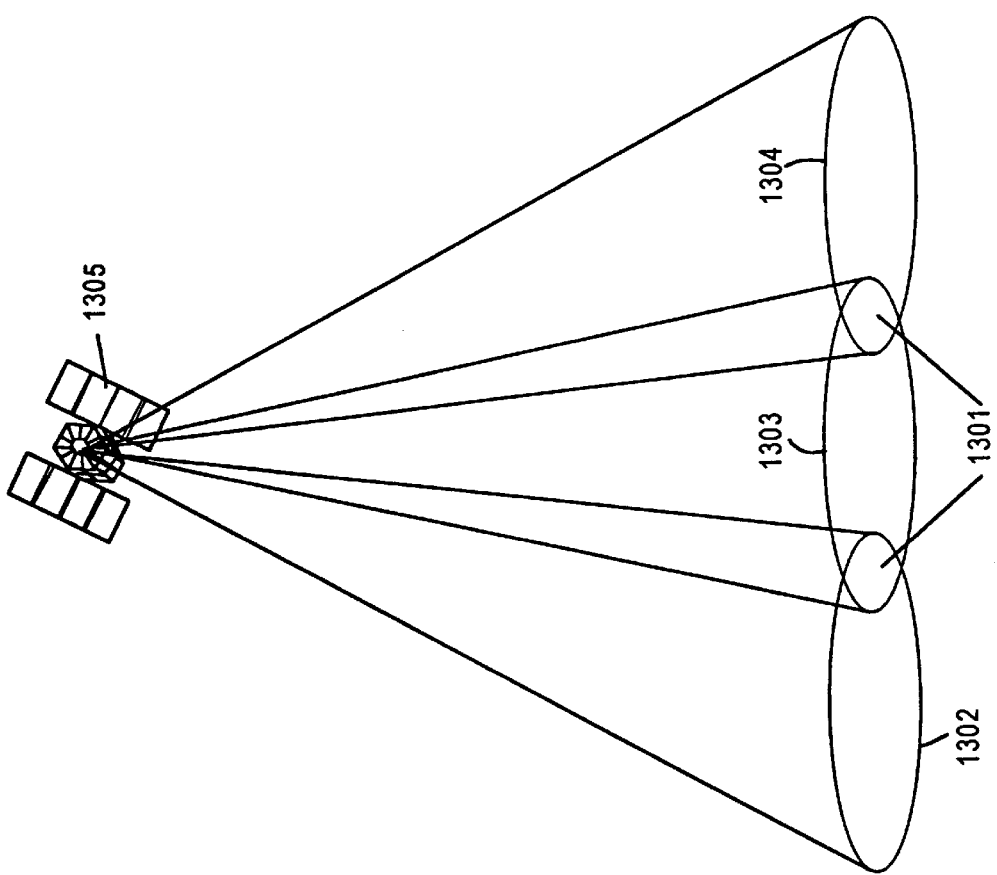
FIG. 13 is a representation of a multi-beam satellite system, which may incorporate concepts of the invention.

As shown in FIG. 13, yet another embodiment of the invention envisions the soft handoff procedures and recursive convolutional iterative decoding effectuating handoffs in the handoff regions 1301 located between overlapping footprints 1302, 1303, and 1304 of a multibeam satellite system 1305. The transmitter and receiver circuitry for beam communication to and from the various footprints all ride in the one satellite.

Figure 15:
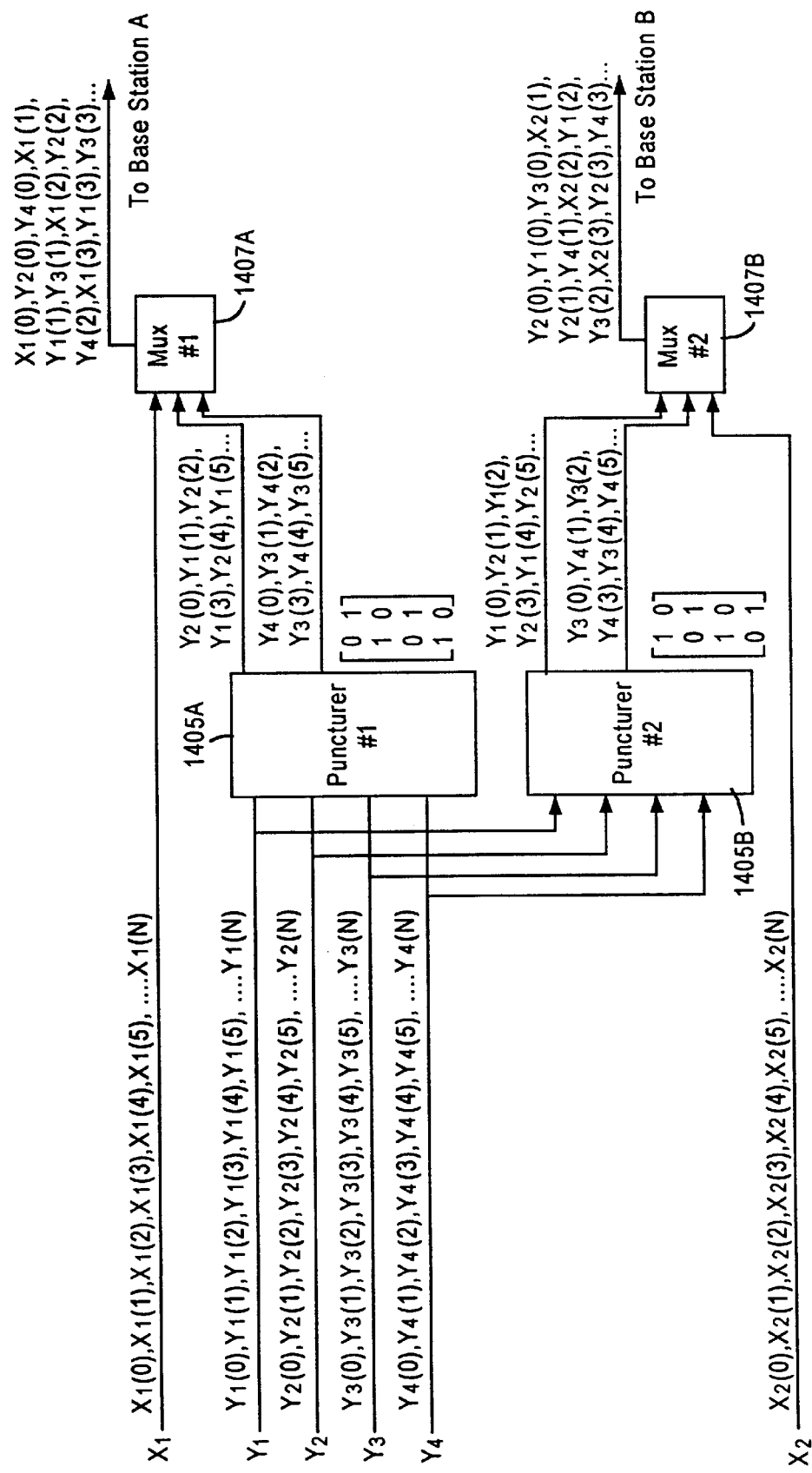
FIG. 15 shows the puncturers and multiplexers of the embodiment of FIG. 14 with the various input and output bit streams, and should be helpful in understanding the operations of the punctures as well as the code rate produced in that embodiment.

In the above discussed embodiments, the code rate during handoff was ¼ (1 input bit encoded into 4 transmitted bits). The transmission side sent one channel of information, containing the original digitized information and a first punctured code stream. The transmission side sent a second channel of information, containing the interleaved version digitized information and a second punctured code stream. However, it is envisioned that communications in accord with the invention may utilize turbo encoding to achieve even lower code rates. In one example noted above, the reverse channel communications in a CDMA cellular system might operate with encoding for a ⅙ code rate. FIGS. 14 and 15 depict elements of a turbo coding system providing a ⅙ code, preferably for use in reverse channel communications.

FIG. 14 provides a high-level functional illustration of this embodiment of the turbo encoder. The turbo encoder receives the digital information $d_k$ intended for transmission at an input 1401. In a cellular handset for telephone communication, for example, the digital information $d_k$ would be a digitized and compressed voice signal from a vocoder or the like. In other applications, the digital information $d_k$ could be virtually any other type of digital data that a user may want to send over the wireless air interface.

The digital information $d_k$ input at 1401 is supplied as a data stream $X_1$ directly to one input of a first multiplexer 1407A. The input 1401 also couples the digital information $d_k$ to the input of an interleaver 1402. The interleaver 1402 interleaves the digital information $d_k$ in a manner similar to that of the interleaver 601 in FIG. 6, to break up cross-correlation between later developed coded sequences.

The turbo encoder also includes two constituent recursive convolutional encoders 1403A, 1403B. The first encoder 1403A receives the digital information $X_1$ directly from the input 1401. The interleaver 1402 supplies an interleaved version of the digital information to the constituent recursive convolutional encoder 1403B.

The constituent recursive convolutional encoder 1403A processes the digital information to produce the two parity sequences $Y_1$, $Y_2$. The constituent recursive convolutional encoder 1403B processes the interleaved version of the digital information to produce the two additional parity sequences $Y_3$, $Y_4$.

Each convolutional encoder 1403 includes a series of delay elements D, shown as four in the illustrated example, and a feedback loop. In each encoder, two different series of taps from the line of delay elements provide the different encoded parity sequences. FIG. 14 shows the constituent encoders 1403A and 1403B as identical systems, each having four delay elements and the same polynomial representations for the two parity sequences. However, the present invention is not limited by the particular polynomials nor by the number of memory elements, which is one less than the constraint length.

For discussion of the example, assume that $g_1$ represents the feed back connection, $g_{21}$ represents one feed forward connection and $g_{22}$ represents the other feed forward connection. The polynomial expressions for these three signals in the encoders are:

$$g_1=1+D^3+D^4$$

$$g_{21}=1+D+D^3+D^4$$

$$g_{22}=1+D^2+D^4 \quad (15)$$

Each constituent recursive convolutional encoder 1403A, 1403B supplies its two parity code sequences to inputs of both of two puncturers 1405A, 1405B. Stated another way, the four inputs to each of the punctures 1405A, 1405B comprise the four parity code sequences $Y_1$, $Y_2$, $Y_3$ and $Y_4$. Each puncturer supplies two separated punctured code sequences to inputs of the corresponding multiplexer.

The first puncturer 1405A supplies its two punctured code sequences to the second and third inputs of the multiplexer 1407A. The multiplexer 1407A combines the first punctured code sequence and second punctured code sequence together with the original digital information in stream $X_1$. For application to reverse channel transmissions by a CDMA handset, for example, the multiplexer 1407A supplies the combined information to a first transmission circuit, for CDMA transmission over a first logical channel to the base station A.

The second puncturer 1405B supplies its two punctured code sequences to the second and third inputs of the multiplexer 1407B. The multiplexer 1407B combines the third punctured code sequence together with the interleaved version of the digital information in the stream identified as $X_2$. In the reverse channel transmission for a CDMA handset example, the multiplexer 1407A would supply the combined information to a second transmission circuit, for CDMA transmission over a second logical channel to the base station B.

FIG. 15 shows the puncturers and multiplexers of the embodiment of FIG. 14 with the various input and output bit streams. In general, the operation of the punctures 1405A and 1405B is similar to that of the puncturers in the earlier embodiment, except that the puncturers are adapted to select and combine portions of four input parity signals to form two punctured sequences. FIG. 15 depicts the puncturing matrices of the two punctures 1407A and 1407B.

The puncturer 1405A actually functions much like a combination of two of the punctures 603A, one of which processes the signals $Y_1$ and $Y_2$ and the other of which processes the signals $Y_3$ and $Y_4$. Similarly, the puncturer 1405B actually functions much like a combination of two of the punctures 603B.

The parity sequence outputs may be represented by:

$Y_1 \Rightarrow y_1(0), y_1(1), y_1(2), y_1(3), \ldots, y_1(n), \ldots, y_1(N);$ $Y_2 \Rightarrow y_2(0), y_2(1), y_2(2), y_2(3), \ldots, y_2(n), \ldots, y_2(N);$ $Y_3 \Rightarrow y_3(0), y_3(1), y_3(2), y_3(3), \ldots, y_3(n), \ldots, y_3(N);$ $Y_4 \Rightarrow y_4(0), y_4(1), y_4(2), y_4(3), \ldots, y_4(n), \ldots, y_4(N) \quad (16)$ As the punctured patterns are applied to the $Y_1$, $Y_2$, $Y_3$ and $Y_4$ sequences by the puncturers, the first output of the puncturer 1405A has the following sequence;

$$y_2(0), y_1(1), y_2(2), y_1(3), y_2(4), y_1(5), \ldots ; \quad (17)$$

as a result of the puncturing pattern [0,1/1,0]. Similarly, as the puncturer 1405A applies the pattern to the $Y_3$ and $Y_4$ sequences by the puncturer, the second output of the puncturer 1405A has the following sequence;

$$y_4(0), y_3(1), y_4(2), y_3(3), y_4(4), y_3(5), \ldots ; \quad (18)$$

as a result of the puncturing pattern [0,1/1,0]. The overall combined puncturing pattern matrix of the puncturer 1405A is [0101/1010].

The first output of the second puncturer 1405B has the following sequence:

$$y_1(0), y_2(1), y_1(2), y_2(3), y_1(4), y_2(5), \ldots ; \quad (19)$$

as a result of the puncturing pattern [1,0/0,1]. As the puncturer 1405B applies that same pattern to the $Y_3$ and $Y_4$ sequences, the second output of the puncturer 1405B has the following sequence $$y_3(0), y_4(1), y_3(2), y_4(3), y_3(4), y_4(5), \ldots \quad (20)$$

The overall combined puncturing pattern matrix of the puncturer 1405B is [1010/0101].

The puncturer 1405A supplies the first two streams (17), (18) to inputs of the first multiplexer 1407A. The multiplexer 1407A cycles repetitively through its three inputs to connect bits therefrom to its one output. The multiplexer 1407A thus combines the bit stream Xl representing the input information together with the first and second punctured sequences. The multiplexer essentially produces a bit stream sequence of:

$$X_1(0), Y_2(0), Y_4(0), X_1(1), Y_1(1), Y_3(1), X_1(2),$$

$$Y_2(2), Y_4(2), X_1(3), Y_1(3), Y_3(3) \quad (21)$$

The puncturer 1405B supplies the first two streams (19), (20) to inputs of the first multiplexer 1407B. The multiplexer 1407B cycles repetitively through its three inputs to connect bits therefrom to its one output. The multiplexer 1407B thus combines the bit stream X2 representing the interleaved version of the input information together with the third and fourth punctured sequences. The multiplexer essentially produces a bit stream sequence of:

$$X_2(0), Y_1(0), Y_3(0), X_2(1), Y_2(1), Y_4(1), X_2(2),$$

$$Y_1(2), Y_3(2), X_2(3), Y_2(3), Y_4(3) \quad (22)$$

The outputs of the two encoders yield four-bits for each single input bit, the combination of the four-bits of encoded signals with a bit of the input information and a bit of the interleaved version of the information produces a total of six bits for transmission derived from the one input bit. Thus, the outputs of the multiplexers provide six bits for transmission for each input bit, yielding a code rate of 1/6.

In the example of a reverse channel transmission from a handset, the sequence (21) goes from the first multiplexer 1407A to a first reverse channel transmission to the base station A. The sequence (22) goes from the first multiplexer 1407B to a second reverse channel transmission to the base station B.

The base stations and associated master switching center receive and decode the 1/6 rate reverse channel transmissions in a manner similar to that used in the receiver of FIGS. 8 and 9. The packet/code combiner and iterative decoder is adapted to six bit streams, specifically the recovered stream corresponding to the input information, the recovered stream corresponding to the interleaved version of the information and the recovered streams corresponding to the four punctured sequences. The two MAP decoders are adapted to process three sequences each, and in particular to perform the inverse of the coding operations of the two encoders 1403A, 1403B.

During in-cell operations, the mobile station transmits one of the streams from one multiplexer to one of the base stations. Consider the transmission to base station A as an example. In such a case, the mobile station transmits the sequence (21) from the first multiplexer 1407A to the base station A. The base station A and master switching center process the bits for the three sequences in that stream (code rate 1/3) to derive an accurate representation of the original input information. Similarly, when the mobile station transmits over the reverse channel only to the base station B, the mobile station transmits the sequence (22) from the second multiplexer 1407B. The base station B and master switching center process the bits for the three sequences in that stream (code rate 1/3) to derive an accurate representation of the original input information.

Figure 16:
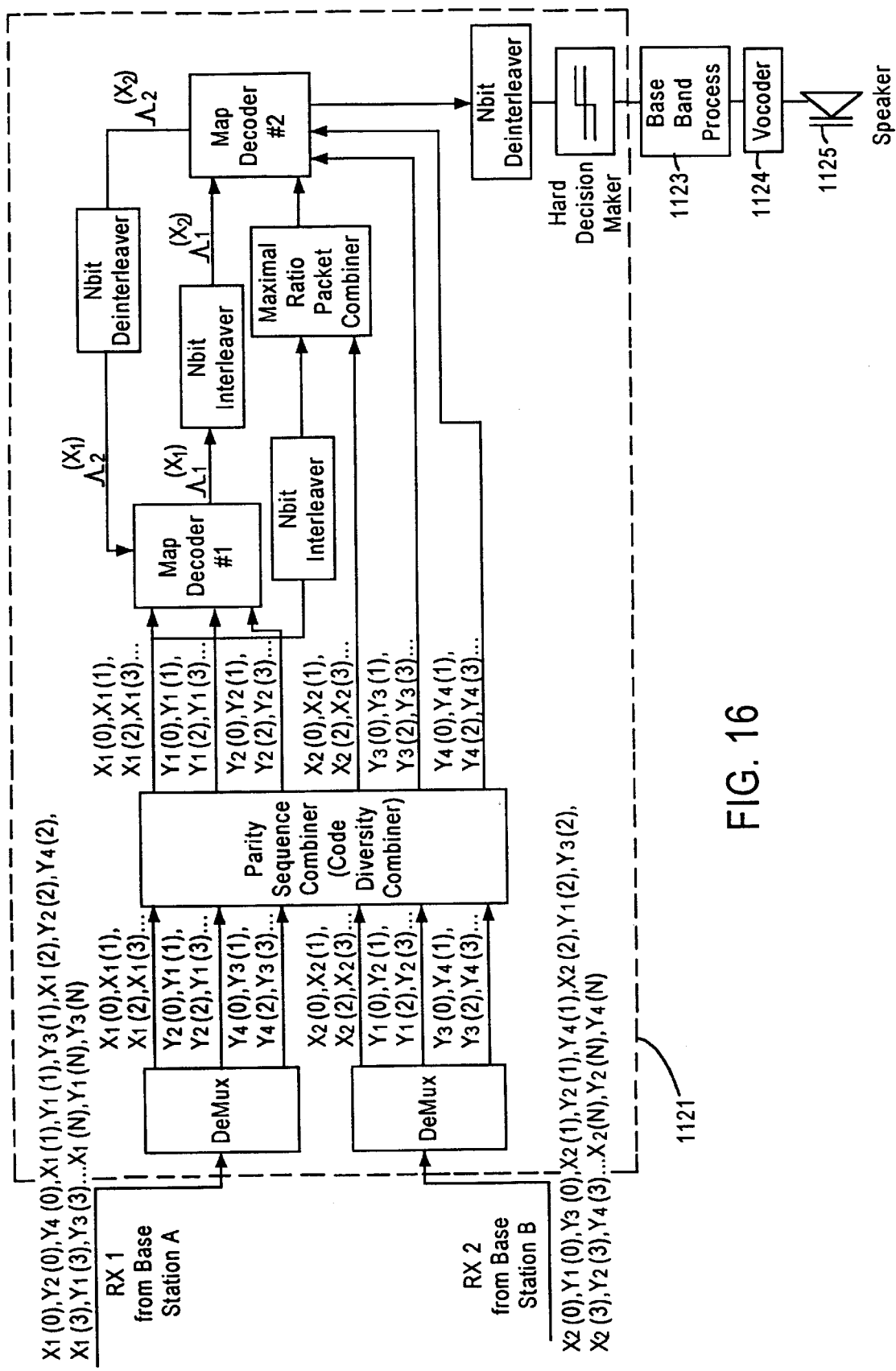
FIG. 16 depicts an exemplary reverse traffic signal decoder at the base stations and master switching center, during handoff, for the case of a code rate of ⅙.

An example of the reverse channel parity code combiner in conjunction with an iterative decoder is shown in detail in FIG. 16. The operational concept is similar to that of the forward channel.

While the foregoing has described what are considered to be preferred embodiments of the invention, it is to be understood that the invention is not limited to those precise embodiments. Various modifications may be made, the invention may be implemented in various forms and embodiments, and it may be applied in numerous applications, only some of which have been described herein. It is intended by the following claims to claim all such modifications and variations which fall within the true scope of the invention.

What is claimed is:

1. A mobile communication system, comprising:
   a source of digital data, for communication to or from a predetermined one of a plurality of mobile stations;
   a first constituent encoder, coupled to the source, for encoding the digital data into a first code sequence;
   an interleaver, coupled to the source, for interleaving the digital data;
   a second constituent encoder, coupled to the interleaver, for encoding the interleaved digital data into a second code sequence;
   a first code puncturer, coupled to the first and second constituent encoders, for selectively combining data from the first code sequence and data from the second code sequence according to a first puncturing pattern, to form a first punctured code sequence;
   a second code puncturer, coupled to the first and second constituent encoders, for selectively combining data from the second code sequence and data from the first code sequence according to a second puncturing pattern, to form a second punctured code sequence;
   first and second transmitters for transmission of information on first and second logical channels assigned to the predetermined mobile station; and
   wherein at least during a handoff operation, the first transmitter broadcasts the first channel carrying a first representation of the digital data together with the first punctured code sequence, and concurrently the second transmitter broadcasts the second channel carrying a second representation of the digital data together with the second punctured code sequence.

2. A mobile communication system as in claim 1, wherein the first representation of the digital data is said digital data.

3. A mobile communication system as in claim 2, wherein the second representation of the digital data comprises an interleaved representation of said digital data.

4. A mobile communication system as in claim 1, further comprising a receiver, the receiver comprising:
   at least one antenna for receiving signals from the transmitters;
   processing circuitry coupled to the at least one antenna for recovering data from the first logical channel during handoff and for recovering data from the second logical channel during handoff; and
   an intelligent decoder, coupled to the processing circuitry, for decoding signals from the first and second logical channels during handoff, to recover an accurate representation of the digital data.

5. A mobile communication system as in claim 4, wherein the source, the constituent encoders, the puncturers, the transmitters and the control are elements of the predetermined mobile station.

6. A mobile communication system as in claim 4, wherein the receiver is contained in the predetermined mobile station.

7. A mobile communication system as in claim 6, wherein the first and second transmitters are elements of one or more cellular network base stations.

8. A mobile communication system as in claim 6, wherein the first and second transmitters are elements of one or more satellites.

9. A mobile communication system as in claim 8, wherein the first transmitter is an element of a first satellite and transmits into a first area, and the second transmitter is an element of a second satellite and transmits into a second area.

10. A mobile communication system as in claim 8, wherein the first and second transmitters are elements of a multiple beam satellite.

11. A mobile communication system as in claim 1, wherein each of the first and second constituent encoders comprises a turbo encoder.

12. A mobile communication system as in claim 1, further comprising:
   a first multiplexer for multiplexing the first representation of the digital data together with the first punctured code sequence and supplying multiplexed data to the first transmitter; and
   a second multiplexer for multiplexing the second representation of the digital data together with the second punctured code sequence and supplying multiplexed data to the second transmitter.

13. A receiver system for operation in a mobile wireless communication system, the receiver system comprising:
   receiver circuitry for processing modulated signals associated with a mobile station received from two or more transmitters during a handoff operation, to obtain first and second data streams;
   demultiplexer circuitry, coupled to an output of the receiver circuitry, for processing the first data stream received during handoff to recover digital data corresponding to a first representation of a digital information sequence and a first punctured sequence and to recover digital data corresponding to a second representation of the digital information sequence and a second punctured sequence;
   a code combiner, coupled to the demultiplexer circuitry, for processing the sequences, to recover a first constituent encoded sequence corresponding to the first representation of the digital information sequence and a second constituent encoded sequence corresponding to the second representation of the digital information sequence; and
   a decoder coupled to the code combiner for processing the recovered digital data corresponding to the first and second representations of the digital information sequence and the first and second constituent encoded sequences, to recover an accurate representation of the digital information sequence during the handoff operation.

14. A receiver system as in claim 13, wherein the receiver system is an element of the mobile station.

15. A receiver system as in claim 13, wherein the receiver circuitry comprises circuitry in a first base station of a cellular network and circuitry in a second base station of the cellular network.

16. A receiver as in claim 15, wherein at least the code combiner and decoder are elements located in a master switch center of the cellular network.

17. A receiver system as in claim 13, wherein the receiver circuitry is located in one or more satellites.

18. A mobile receiver as in claim 13, wherein the decoder comprises a turbo decoder.

19. A mobile receiver for operation with a wireless communication system having a plurality of transmitters serving cells or segments of a geographic region, the mobile receiver comprising:
   receiver circuitry for processing received modulated signals intended for the mobile receiver from one or more of the transmitters, wherein during a handoff from one transmitter to another transmitter the receiver circuitry is capable of processing received modulated signals intended for the mobile receiver from at least two of the transmitters, to obtain first and second forward data streams;
   a first demultiplexer, coupled to an output of the receiver circuitry, for processing the first forward data stream received during handoff to recover digital data corresponding to a representation of a digital information sequence intended for the mobile receiver and a first coded sequence;
   a second demultiplexer, coupled to an output of the receiver circuitry, for processing the second forward data stream received during handoff to recover digital data corresponding to another representation of the digital information sequence intended for the mobile receiver and a second coded sequence;
   a code combiner, coupled to the first and second demultiplexers, for processing the first and second coded sequences during handoff, to recover a first constituent encoded sequence corresponding to the first representation of the digital information sequence intended for the mobile receiver and a second constituent encoded sequence corresponding to the second representation of the digital information sequence intended for the mobile receiver; and
   a decoder, coupled to the code combiner, for recovering an accurate representation of the digital information sequence intended for the mobile receiver from the recovered digital data corresponding to at least one of the representations of the digital information sequence intended for the mobile receiver and the first and constituent coded sequences.

20. A mobile receiver as in claim 19, wherein the decoder comprises a turbo decoder.

21. A mobile receiver as in claim 20, wherein the turbo decoder comprises:
   a first decoder for processing one of the representations of the digital information sequence intended for the mobile receiver and the first constituent encoded sequence;
   a packet combiner for combing the two representations of the digital information sequence; and
   a second decoder responsive an output of the first decoder, to an output of the packet combiner and an output of the code combiner corresponding to the second constituent encoded sequence.

22. A mobile receiver as in claim 21, wherein the turbo decoder further comprises:
   an interleaver coupling digital output information from the first decoder to an input of the second decoder;
   a first deinterleaver providing feedback from the second decoder to the first decoder; and
   a second deinterleaver for deinterleaving an output from the second decoder.

23. A mobile receiver as in claim 21, wherein the first and second decoder comprise MAP decoders.

24. A method of communicating digital data in a mobile wireless communication network, comprising:
   detecting a need for handoff of service for a predetermined mobile station; and
   executing a handoff operation, said handoff operation comprising:
      (a) constituent encoding the digital data into a first code sequence,
      (b) interleaving the digital data,
      (c) constituent encoding the interleaved digital data into a second code sequence,
      (d) selectively combining data from the first code sequence and data from the second code sequence according to a first puncturing pattern to form a first punctured code sequence,
      (e) selectively combining data from the first code sequence and data from the second code sequence according to a second puncturing pattern to form a second punctured code sequence,
      (f) transmitting on a first path, over a first logical channel, a first representation of the digital data and the first punctured code sequence,
      (g) transmitting on a second path, over a second logical channel, a second representation of the digital data and the second punctured code sequence,
      (h) in a receiver, combining the first punctured code sequence with the second punctured code sequence to recover at least portions of the first and second code sequences, and
      (i) recovering an accurate representation of the digital data from received portions of one or more of the representations of the digital data, at least a recovered portion of the first encoded sequence, and at least a recovered portion of the second encoded sequence.

25. A method as in claim 24, wherein the step of transmitting comprises transmitting from at least one network station to the predetermined mobile station.

26. A method as in claim 24, wherein the step of transmitting comprises transmitting from the predetermined mobile station.

27. A method as in claim 24, wherein at least one of the representations of the digital data comprises the digital data.

28. A method as in claim 24, wherein at least one of the representations of the digital data comprises an interleaved representation of the digital data.

* * * * *